United States Patent [19]

Oshelski et al.

[11] Patent Number: 5,586,059
[45] Date of Patent: Dec. 17, 1996

[54] AUTOMATED DATA MANAGEMENT SYSTEM FOR ANALYSIS AND CONTROL OF PHOTOLITHOGRAPHY STEPPER PERFORMANCE

[75] Inventors: Anastasia L. Oshelski, Austin; Paul Ackmann, Buda; Stu Brown; Richard Edwards, both of Austin, all of Tex.

[73] Assignee: Advanced Micro Devices, Inc., Austin, Tex.

[21] Appl. No.: 476,937

[22] Filed: Jun. 7, 1995

[51] Int. Cl.$^6$ ........................................... G06F 17/60
[52] U.S. Cl. ................... 364/552; 364/468.26; 364/578; 364/580; 364/468.28; 355/204
[58] Field of Search ........................ 364/552, 468, 364/578, 474.24, 571.04, 580; 355/204, 53; 437/7

[56] References Cited

U.S. PATENT DOCUMENTS

| | | | |
|---|---|---|---|
| 4,873,623 | 10/1989 | Lane et al. | 364/188 |
| 5,120,134 | 6/1992 | Kosugi | 356/401 |
| 5,206,582 | 4/1993 | Ekstedt et al. | 324/73.1 |
| 5,226,118 | 7/1993 | Baker et al. | 395/161 |
| 5,243,377 | 9/1993 | Umatate et al. | 355/53 |
| 5,245,554 | 9/1993 | Tsuyama et al. | 364/552 |
| 5,355,320 | 10/1994 | Erjavic et al. | 364/488 |
| 5,390,131 | 2/1995 | Rohrbaugh et al. | 364/490 |
| 5,412,758 | 5/1995 | Srikanth et al. | 395/75 |
| 5,452,218 | 9/1995 | Tucker et al. | 364/468 |
| 5,455,894 | 10/1995 | Conboy et al. | 395/82 |
| 5,465,221 | 11/1995 | Merat et al. | 364/552 |

*Primary Examiner*—Emanuel T. Voeltz
*Assistant Examiner*—Hien Vo
*Attorney, Agent, or Firm*—Haynes and Boone, L.L.P.

[57] ABSTRACT

An automated data management system for enabling the analysis and control of the performance of photolithography steppers in a submicron fabrication facility is disclosed. In a preferred embodiments, software running on each of a plurality of first personal computers (PCs), each of which is connected to one of a plurality of steppers, is used to append printer data generated by the steppers responsive to tests performed therein to ASCII files associated with the steppers and subsequently to upload the ASCII files to a network drive at specified time intervals. Once the ASCII files have been uploaded to the VAX drive, the files may be accessed by a user outside the facility using a second PC on which is running a utility of the present invention for providing automated analysis of the data for a particular stepper as requested by a user. In one aspect of the invention, the utility of the present invention comprises a windows-based user interface for enabling the user to select and initiate analysis procedures by selecting from a variety of options displayed on the user's PC. In another aspect of the invention, the utility of the present invention enables the user to select from among a variety of formats, including browse tables, charts and graphs, for viewing the resulting analysis data.

26 Claims, 30 Drawing Sheets

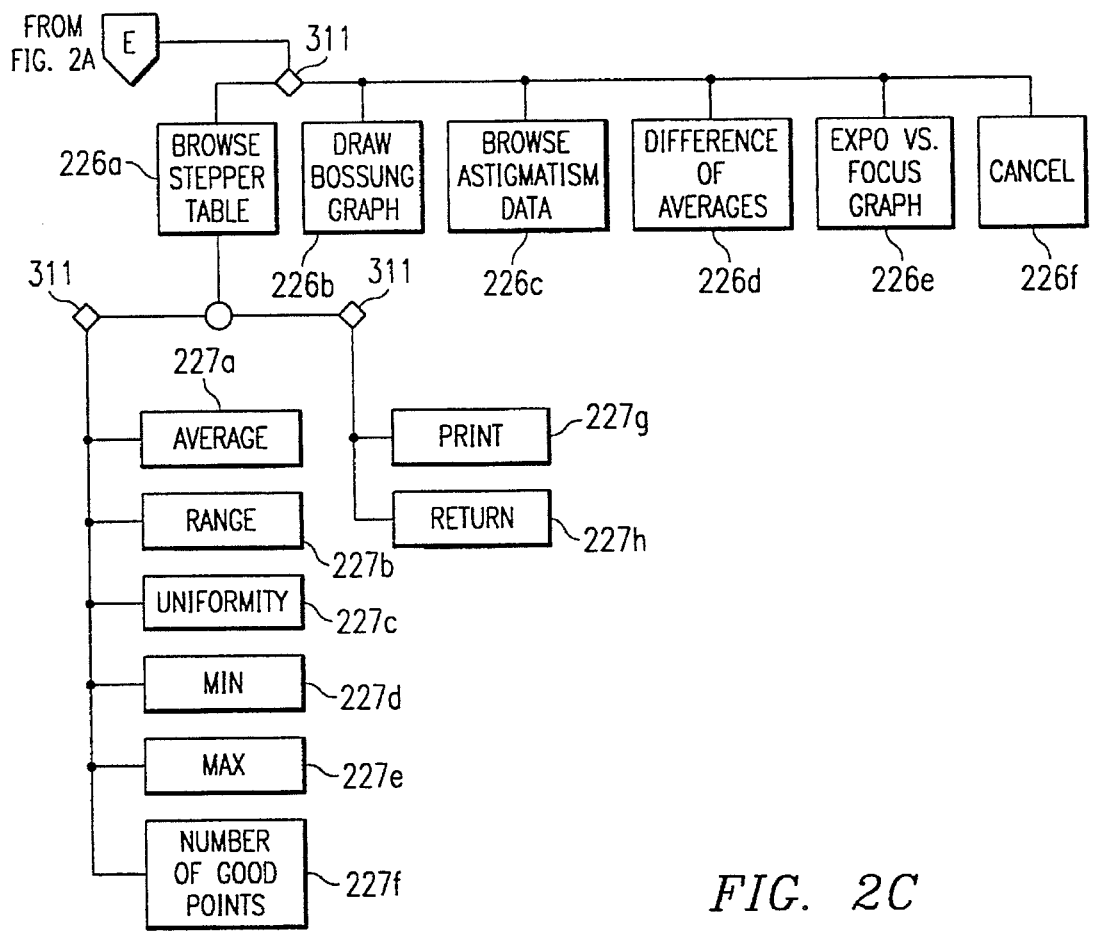
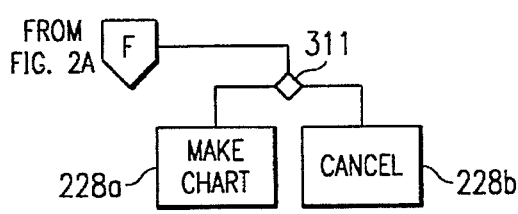
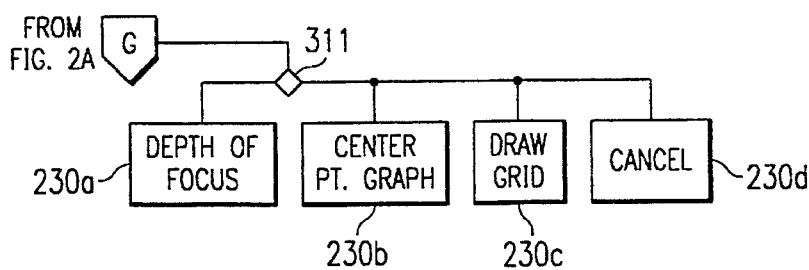
FIG. 2C

| STEPPER # | LAST DATE | TIR | < .5 | .5-.75 | >.75-1.0 | >1.0 |
|---|---|---|---|---|---|---|
| 1 | 09/22/93 | 1.2426 | 98.0 | 2.0 | 0.0 | 0.0 |
| 2 | 01/14/93 | 1.9196 | 96.0 | 3.0 | 1.0 | 0.0 |
| 3 | 01/26/93 | 2.7707 | 95.0 | 1.0 | 1.0 | 3.0 |
| 4 | 02/03/93 | 1.7566 | 100.0 | 0.0 | 0.0 | 0.0 |
| 5 | 05/16/93 | 1.3450 | 98.0 | 2.0 | 0.0 | 0.0 |
| 6 | 11/25/92 | 2.2697 | 92.0 | 5.0 | 4.0 | 0.0 |
| 7 | 08/31/93 | 2.3737 | 97.0 | 2.0 | 0.0 | 1.0 |
| 8 | 09/15/93 | 1.7524 | 97.0 | 3.0 | 1.0 | 0.0 |
| 9 | 06/29/93 | 1.5424 | 98.0 | 2.0 | 0.0 | 0.0 |
| 10 | 09/22/93 | 1.2426 | 98.0 | 2.0 | 0.0 | 0.0 |

LAST CHUCK FLATNESS DATA FOR EACH STEPPER

<CONTINUE>   <PRINT DATA>

STEPPER # : 10
MONTH : May

FIG. 9

| CODE | ERROR MESSAGE | NUMBER OCCURED | % OF TOTAL |
|---|---|---|---|
| E1 | wtable_prealign_wafer: Wafer prealigned after 0 mechanical and | 270 | 49.45 |
| E5 | PWHFEE: Error: No wafer on P-table. | 34 | 6.23 |
| E4 | windxr_feed_wafer: Error: No wafer on P-table. | 32 | 5.86 |
| E2 | wtable_prealign_wafer: Wafer NOT prealigned after 0 mechanical | 29 | 5.31 |
| E3 | wtable_prealign_wafer: Error: Optical prealignment failure. | 29 | 5.31 |
| E8 | Command Handler activated by ASM from Start Batch menu. | 28 | 5.13 |
| E9 | Returned to Start Batch menu from Command Handler. | 28 | 5.13 |
| E10 | windxr_stop_belts: Front Discharge belts stopped after 2 tries | 22 | 4.03 |
| E11 | windxr_stop_belts: Front Feed belts stopped after 2 tries. | 21 | 3.85 |
| E6 | RH: Error in HBAREAD, timeout; barcode not present? | 13 | 2.38 |
| E7 | RH :: H4SEIN2 : Slot-number is 1 | 6 | 1.10 |
| E17 | EP_expose : error X at cell nr Y | 4 | 0.73 |
| E15 | RH :: H4SEIN2 : Slot-number is 6 | 3 | 0.55 |
| E18 | PWHSWA: Error: E-table not in load position. | 3 | 0.55 |
| E12 | xi_stage: not all home end VSOs detected, DIC5B=8800 | 2 | 0.37 |
| E13 | xm_settle: settling time out | 2 | 0.37 |
| E19 | xy_error: fast pulse convertor error. dic5a=E90E | 2 | 0.37 |
| E20 | RH :: H4SEIN2 : Slot-number is 4 | 2 | 0.37 |
| E23 | ASPRIMA: No transition pairs found | 2 | 0.37 |
| E30 | il_update: lamp extinguished | 2 | 0.37 |
| E14 | xi_stage: not all zero signals present, DIC5a=E106 | 1 | 0.18 |
| E16 | ALTOTAL: wafer rotation error during last or previous alignment | 1 | 0.18 |
| E21 | windxr_discharge_wafer: Error: Wafer did not reach the back-di | 1 | 0.18 |
| E22 | PWHDIS: Error: Wafer did not reach the back-discharge indexer. | 1 | 0.18 |
| E24 | l_level: move stamp down time out | 1 | 0.18 |
| E25 | EC-leveling error 12010 | 1 | 0.18 |
| E26 | 12010 pstexp exposure control error. | 1 | 0.18 |
| E27 | pstbat: Timeout detected at stamp down. | 1 | 0.18 |
| E28 | RH :: H4SEIN2 : Slot-number is 2 | 1 | 0.18 |
| E29 | xi_stage: not all zero signals present, DIC5a=E104 | 1 | 0.18 |
| E31 | IQ-Exception : Zero divide | 1 | 0.18 |
| E32 | RH :: H4SEIN2 : Slot-number is 5 | 1 | 0.18 |

TOTAL ERRORS: 546

ERROR CODE OCCURRENCES BY STEPPER
MONTH: May
DAYS: 1 TO 31
ERROR: prealign

| STEPPER # | # OF OCCURRENCES |
|---|---|
| 1 | 420 |
| 2 | 169 |
| 3 | 82 |
| 4 | 37 |
| 5 | 186 |
| 6 | 4 |
| 7 | 127 |
| 8 | 234 |
| 9 | 526 |
| 10 | 328 |

MOST RECENT THROUGHPUT DATA FOR EACH STEPPER

| STEPPER # | LAST DATE | START TIME | END TIME | ELAPSED TIME (s) | WAFER/HR |
|---|---|---|---|---|---|
| 1 | 05/25/93 | 09:44:19 | 09:47:44 | 205 | 52.7 |
| 2 | 05/31/93 | 12:04:22 | 12:07:58 | 216 | 50.0 |
| 3 | 06/15/93 | 10:03:44 | 10:07:08 | 204 | 52.9 |
| 4 | 06/15/93 | 08:50:32 | 08:53:44 | 192 | 56.3 |
| 5 | 02/09/93 | 10:55:34 | 10:58:34 | 180 | 60.0 |
| 6 | 06/14/93 | 14:53:43 | 14:57:20 | 217 | 49.8 |
| 7 | 05/23/93 | 13:32:06 | 13:36:20 | 254 | 42.5 |
| 8 | 06/14/93 | 13:20:59 | 13:24:55 | 236 | 45.8 |
| 9 | NO DATA | | | | |
| 10 | 12/19/92 | 10:19:46 | 10:22:51 | 185 | 58.4 |

MAIN SCREEN FOR PROMETRIX ANALYSIS

\<Read Data From ASCII File\>

\< Analysis \>

\<Lens Comparison\>

\<Intrafield Analysis\>

\<Quit Prometrix Program\>

*FIG. 14*

DISPLAY SCREEN FOR STEPPER PARAMETERS
PARAMETER = AVERAGE

STEPPER : 8
DATE : 02/04/93
CD SIZE : .6
STRUCTURE : Dense
SIGMA : 6

| | | EXPOSURE | | | | |
|---|---|---|---|---|---|---|
| | | 100 | 110 | 120 | 130 | 140 |
| | -1.2 | 0.9412 | 0.9218 | 0.9023 | 0.7909 | 0.6913 |
| F | -0.8 | 0.9322 | 0.9078 | 0.8039 | 0.7532 | 0.6933 |
| O | -0.4 | 0.9625 | 0.8644 | 0.7642 | 0.7172 | 0.6747 |
| C | 0.0 | 0.9444 | 0.8250 | 0.7484 | 0.7032 | 0.6611 |
| U | 0.4 | 0.9665 | 0.8345 | 0.7567 | 0.6993 | 0.6645 |
| S | 0.8 | 0.0000 | 0.8766 | 0.7797 | 0.7111 | 0.6955 |
| | 1.2 | 0.0000 | 0.9120 | 0.8620 | 0.7911 | 0.7200 |

\<PRINT\>   \<RETURN\>

*FIG. 15*

EXPOSURE MATCHING ASSIGNMENTS

COAT

COAT TRACK: _____ COAT PROGRAM: 15  COAT OPERATOR: _____ TIME: _____
                                1/1/1

EXPOSE-ASM  JOB: EXPOMATCH-X ; 'X'=ROW #  EXPO: 170  FOCUS: MACH. FOCUS
RETICLE: ASMPROREVB

| STEPPER TYPE | STEPPER # | ROW # | DATE | TIME | LAMP HRS |
|---|---|---|---|---|---|
| ASM | 01 | B | | | |
| ASM | 02 | C | | | |
| ASM | 03 | D | | | |
| ASM | 04 | E | | | |
| ASM | 05 | F | | | |
| ASM | 06 | G | | | |
| ASM | 11 | H | | | |

DEVELOP
*NOTE* Do not develop until all steppers have made exposure passes.

DEV TRACK: _____ DEV PROGRAM: 11  DEV OPERATOR: _____ TIME: _____
                                1/1/1

ETCH

DEEP UV BAKE: _____ PROGRAM: P           OPERATOR: _____ TIME: _____
ETCH TEGAL: _____ PROGRAM: POLY          OPERATOR: _____ TIME: _____
BRANSON: _____ PROGRAM: PRODUCTION       OPERATOR: _____ TIME: _____

HOLD

* HOLD FOR CINDY KISTLER/MELANIE NEWMAN

*FIG. 24A*

EXPOSURE MATCHING ASSIGNMENTS

COAT

COAT TRACK:_____  COAT PROGRAM: 15   COAT OPERATOR:_____   TIME:_____
                           1/1/1

EXPOSE-ASM  JOB: EXPOMATCH-X ; 'X'=ROW # EXPO: 170 FOCUS: MACH. FOCUS
RETICLE: ASMPROREVB
Focus: Mach. Focus + Offset

| STEPPER TYPE | STEPPER # | ROW # | DATE | TIME | LAMP HRS |
|---|---|---|---|---|---|
| ASM | 7 | BB | _____ | _____ | _____ |
| ASM | 8 | CC | _____ | _____ | _____ |
| ASM | 9 | DD | _____ | _____ | _____ |
| ASM | 10 | EE | _____ | _____ | _____ |
| ASM | 12 | AA | _____ | _____ | _____ |

DEVELOP
*NOTE* Do not develop until all steppers have made exposure passes.

DEV TRACK:_____  DEV PROGRAM: 11   DEV OPERATOR:_____   TIME:_____
                          1/1/1

ETCH

DEEP UV BAKE:_____ PROGRAM: P           OPERATOR:_____   TIME:_____
ETCH TEGAL:_____   PROGRAM: POLY        OPERATOR:_____   TIME:_____
BRANSON:_____      PROGRAM: PRODUCTION  OPERATOR:_____   TIME:_____

HOLD

* HOLD FOR CINDY KISTLER/MELANIE NEWMAN

| Date | Version | Stp_type | Stp_num | Cd_avg | Lamp_hours | Tegal_num | Row | Comments |
|---|---|---|---|---|---|---|---|---|
| 01/24/95 | 1 | AG | 01 | | | 1 | A | |
| 01/24/95 | 1 | AG | 02 | | | 1 | B | |
| 01/24/95 | 1 | AG | 03 | | | 1 | C | |
| 01/24/95 | 1 | AG | 04 | | | 1 | D | |
| 01/24/95 | 1 | AG | 05 | | | 1 | E | |
| 01/24/95 | 1 | AG | 06 | | | 1 | F | |
| 01/24/95 | 1 | AG | 11 | | | 1 | G | |

ENTER AVERAGE AND ROW FOR EACH STEPPER: PRESS CNTL :: – SAVE

<Return to Main Menu>

F1=HELP → & ← TO MOVE BETWEEN TOPICS ↓ & ↑ TO MOVE WITHIN A TOPIC 7:45:42 am

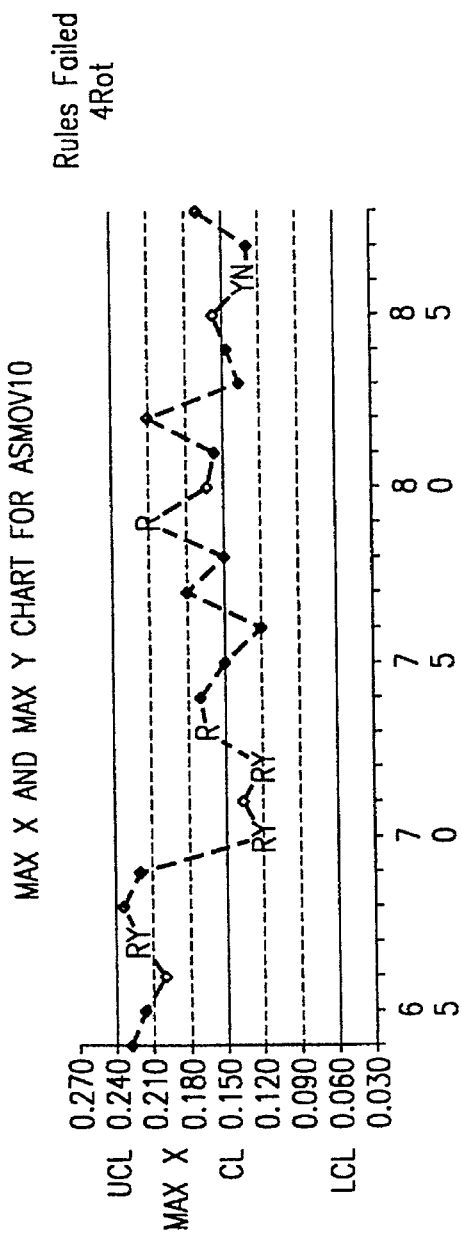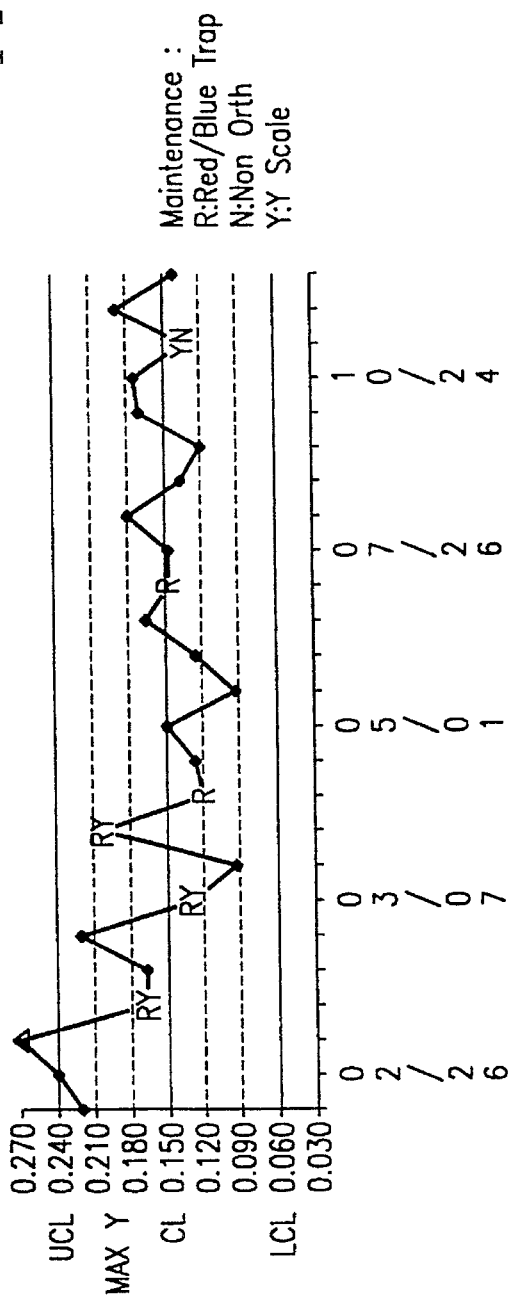
FIG. 32B

AUTOMATED DATA MANAGEMENT SYSTEM FOR ANALYSIS AND CONTROL OF PHOTOLITHOGRAPHY STEPPER PERFORMANCE

TECHNICAL FIELD

The invention relates generally to analysis and control of equipment used in submicron fabrication facilities and, more particularly, to an automated data management system for facilitating the analysis and control of the performance of photolithography steppers in such facilities.

BACKGROUND OF THE INVENTION

Photolithography, defined as a process for effecting the photographic transfer of a pattern to a surface for etching or implanting, is employed in the fabrication of myriad types of semiconductor devices, including integrated circuit (IC) devices. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography stepper apparatus, or "stepper," is typically used to expose the resist layer. An image of each layer of an IC die is formed on a small, rectangular piece of glass referred to as a reticle, or "mask." The mask is placed on the stepper and a reduced image thereof is projected onto a portion of the resist layer covering the semiconductor wafer.

Where numerous ICs are to be fabricated from a single wafer, a mask used in the fabrication of any one IC is also used in the fabrication of the other ICs from the wafer. This is accomplished by using a stepper to index, or "step," the wafer under an optical system including the mask. At each step, the photoresist is exposed by the optical system, typically with ultraviolet light, to form an aerial image of the mask in the layer of photoresist. The wafer is then removed from the stepper and the image developed. At that point, the wafer is etched to remove portions of the underlying film or implant to prepare the wafer for the next stage of material deposition or other types of etching processes. At a later stage in the fabrication process, the wafer is returned to the stepper for exposure of the wafer dies to another mask.

Clearly, it is imperative to the manufacture of high quality ICs that the performance of each stepper be maintained at an optimum level. For this purpose, most steppers currently available, such as those available from ASM Lithography, Inc., located in Eindhoven, Netherlands, are capable of generating reports comprising results of selected tests performed with the stepper, which reports are typically printed on a printer associated with the stepper. Such reports provide raw data regarding stepper performance; however, not all provide analysis of the raw stepper data. Accordingly, analysis must be performed by hand or by manually entering the data into a computer running an appropriate analysis program.

For example, one test typically performed on a stepper is a chuck flatness test for testing the flatness of a stepper's chuck. The chuck flatness test makes four scans across the wafer measuring chuck height at specified points along the scan line. Each scan measures focal deviation from one edge of the chuck to the other in one millimeter (1 mm) increments for a total of 600 data points. FIG. 1A shows the four scans 2A, 2B, 2C and 2D, respectively, and three vacuum rings 4A, 4B and 4C, respectively, Located at diameters of 150, 125 and 100 mm. A user would typically take a printout of the results of this test, which includes data for 600 data points, and manually input into a commercially available statistical modelling program, such as RS1 available from BBN Software Products Corporation of Cambridge, Mass. If the results of the test are within an acceptable range, the stepper is released to production; otherwise, the chuck is appropriately adjusted and the test is repeated. Typically, the stepper is not in production use during the testing procedure, which often takes four to five hours from the time the data is obtained to the time it is analyzed and acted upon. Clearly, therefore, such testing can result in a substantial amount of down time for the stepper.

Automating the collection and analysis of data generated by a plurality of steppers in a fab would be beneficial in that it would reduce the amount of time spent manually entering the data into analysis programs, increase the rate of data transfer to analysis and decrease the number and possibility of data entry errors. In addition, automation would provide a foundation for a paperless fab. Automation would also free up engineering time spent in rectifying data entry errors. The overwhelming amount of data collected requires the streamlining of data analysis needed for timely continuous improvement and control.

In this regard, at least one program, in particular, a Virtual Paperless Equipment Logging System hereinafter referred to as "VPELS," has been developed which collects the raw stepper data, saves the data to an ASCII file, and periodically uploads the ASCII files to a network drive, at which point it may be downloaded to and printed using a printer located outside the fab itself, thereby providing a foundation for a paperless fab. In addition, commercial programs are available for use in analyzing stepper performance; however, the raw stepper data must be manually entered into one or more of the appropriate programs before it can be processed by same, making this method undesirable for the reasons set forth above with regard to engineering time. Moreover, most such programs provide for limited types of analysis, often requiring the engineer to retype the same data several times into several different programs to obtain the desired analysis.

Therefore, what is needed is a system for automating both data collection and analysis of stepper performance data, thereby to reduce the number of man-hours spent manually analyzing and/or entering the data for analysis while providing a greater degree of flexibility with regard to the types of analysis that may be performed.

SUMMARY OF THE INVENTION

The foregoing problems are solved and a technical advance is achieved by method and apparatus for an automated data management system for enabling the analysis and control of the performance of photolithography steppers in a submicron fabrication facility ("fab"). In a departure from the art, Virtual Paperless Equipment Logging System ("VPELS") software running on each of a plurality of first personal computers (PCs), each connected to one of a plurality of steppers, is used to append printer data generated by the steppers responsive to tests performed therein to ASCII files associated with the steppers and subsequently to upload the ASCII files to a network drive, which in the preferred embodiment is a VAX drive, via a network connection at specified time intervals. Once the ASCII files have been uploaded to the VAX drive, the files may be accessed by a user outside the fab using a second PC on which is running a utility of the present invention for providing automated analysis of the data for a particular stepper as requested by a user.

In a preferred embodiment, once initiated by a user, the utility of the present invention prompts the user to select a type of analysis to be performed and to enter a stepper number identifying the stepper to be analyzed. The user will also be prompted to enter any additional information necessary for the performance of the selected analysis option. Exemplary analysis options include, but are not limited to, chuck flatness, chuck levelness, throughput, critical dimensions (CDs), linewidth, depth of focus, exposure and dose matching, and overlay. Once the user has selected a stepper and type of analysis, the utility scans the ASCII file of the selected stepper for new data, parses and saves such new data in databases on the VAX drive and then performs the selected analysis on the data, outputting the results of such analysis in a manner selected by the user.

In one aspect of the invention, the utility of the present invention comprises a windows-based user interface for enabling the user to select and initiate analysis procedures by selecting from a variety of options displayed on the user's PC. in another aspect of the invention, the utility of the present invention enables the user to select from among a variety of formats, including browse tables, charts and graphs, for viewing the resulting analysis data.

A technical advantage achieved with the invention is that it enables stepper data to be stored in a centralized location accessible by users within or without of the fab.

Another technical advantage achieved with the invention is that it substantially reduces the amount of time needed to analyze stepper performance, provides users with a set of standardized methods for stepper analysis, and reduces the use of multiple database programs.

Yet another technical advantage achieved with the invention is that it provides for historical, as well as current, data to be output in various forms, such as customized reports, focus exposure curves, data tables, and SPC charts.

BRIEF DESCRIPTION OF THE DRAWINGS

FIGS. 2A–2E illustrate an interface block diagram as a hierarchical illustration of the user interface options provided by the system of the present invention.

FIG. 9 illustrates an error code distribution sheet generated using the system of the present invention.

FIG. 13 illustrates a table of the most recent throughput data for each stepper generated using the system of the present invention.

FIG. 14 illustrates a Main Screen For Prometrix Analysis of the system of the present invention.

FIG. 15 illustrates a table of a particular stepper parameter generated using the system of the present invention.

FIGS. 24A and 24B illustrate an Exposure Matching Assignments printout generated by the system of the present invention.

FIG. 25 illustrates an assigmnent table of the system of the present invention.

FIGS. 32A and 32B illustrate Stepper SPC Charts generated by the system of the present invention.

DESCRIPTION OF THE PREFERRED EMBODIMENT

Figure 1A:
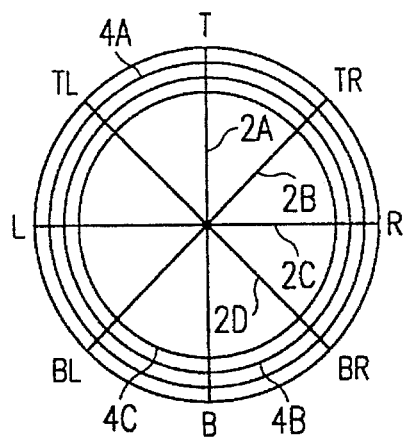
FIG. 1A illustrates a chuck flatness test performed on a stepper chuck for analyzing stepper performance.
Figure 1B:
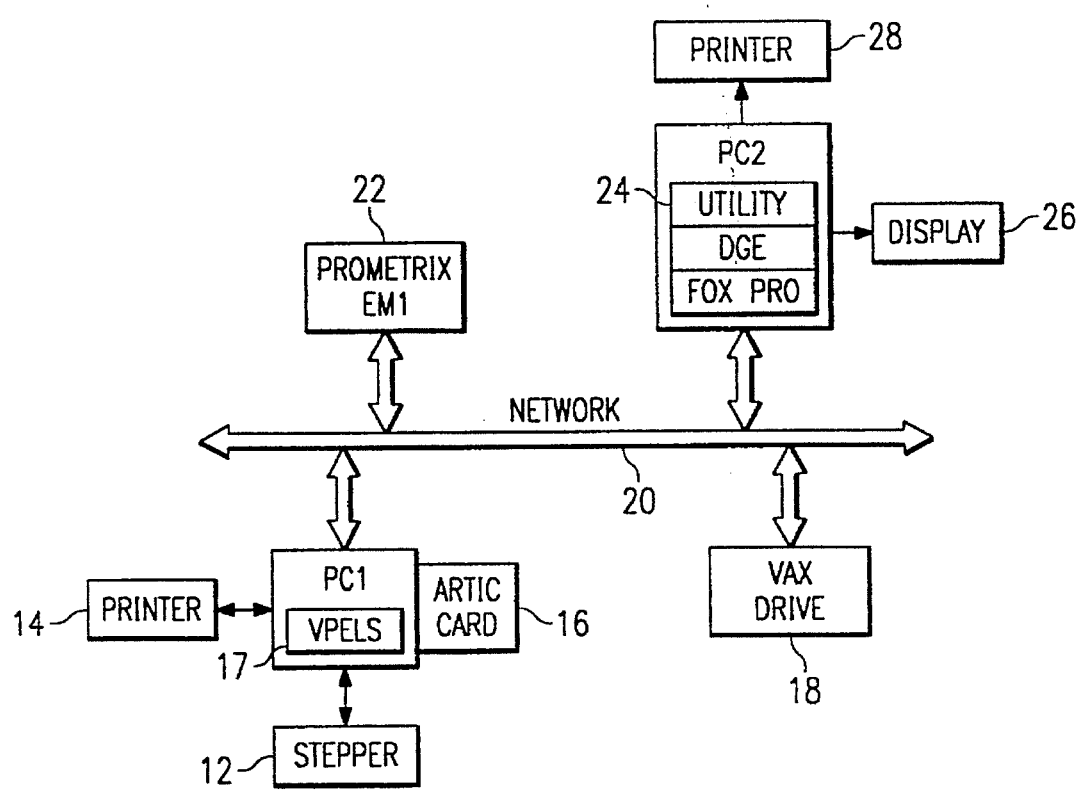
FIG. 1B is a block diagram of a hardware environment in which the system of the present invention may be implemented.

Referring to FIG. 1B, at least one photolithography stepper, such as a stepper 12, which may be, for example, an ASML stepper available from ASM Lithography, Inc., Eindhoven, Netherlands, is electrically connected to a first PC, designated PC1. As described above, performance and other tests are periodically performed on the stepper 12. Accordingly, raw data comprising the results of such tests may be output to and printed on a serial printer 14 connected to PC1 for subsequent analysis, either by hand or using a specialized software program. Alternatively, PC1, using an ARTIC (A Real Time Interface Coprocessor) card 16 available from International Business Machines, Inc., Armonk, N.Y., and VPELS software 17 appends the data to ASCII-format stepper files. It should be understood that any number of stepper/PC/printer combinations may be connected to the network 20 in a manner similar to the stepper 12/PC1/printer 14 combination.

In addition, a device 22 for measuring critical dimensions (CDs) and line widths is connected to the network 20. In a preferred embodiment, the device 22 is an EM1 available from Prometrix Corporation of Santa Clara, Calif. Data from the EM1 22 is also periodically uploaded to the VAX drive 18 in the form of ASCII files.

As will subsequently be described in detail, at least one second PC, for example, PC2, is also connected to the network 20 and is used to initiate execution of a software utility 24 stored thereon for implementing the system of the present invention for accessing appropriate stepper and Prometrix EM1 files stored on the VAX drive 18, performing requested analytical procedures on the accessed data and displaying the analysis results in a user-selected format, which may include, for example, customized reports, focus exposure curves, data tables, and SPC and other charts and graphs. In a preferred embodiment, the utility 24 is implemented using the FoxPro database language, available from Microsoft, Inc., of Redmond, Wash., and a dGE graphics package, available from Pinnacle Publishing, Inc., of Kent, Wash. In general, the utility 24 extracts data from stepper and Prometrix EM1 ASCII files, using known file manipulation and string parsing functions provided by FoxPro, and stores the data in databases located on the VAX drive 18. If the ASCII file(s) to be processed does not have a structured format, the utility searches for key words and parses the appropriate data using pieces of the file stream. If the file has a structured format, with each field delimited by a comma or blank, then direct file-to-database transfer is possible. As previously indicated, the utility 24 stores all data read from the ASCII files in databases on the VAX drive 18. As with the stepper/PC1/printer, there may be any number of second PCs such as PC2 connected to the network 20 for the above-described purposes.

PC2 is further connected to a display 26 for displaying various screen displays generated by the utility 24, as will be described, and to a printer 28 for printing results of analyses performed by the utility 24. It should be understood that, although not shown, at least one input device, such as a keyboard or a mouse, will also be connected to PC2 for enabling user input to the utility 24.

Figure 1C:
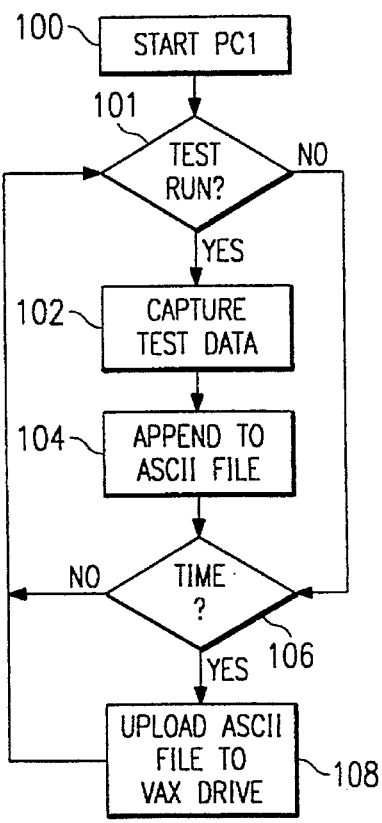
FIG. 1C is a flowchart of the operation of the system of the present invention for collecting and uploading data generated by steppers during testing thereof to a VAX drive.

FIG. 1C is a flowchart of the operation of PC1, using the ARTIC card 16 and VPELS software 17, for collecting data from the stepper 12 and uploading it to the VAX drive 18.

Execution begins in step 100 when PC1 is turned on. In step 101, a determination is made whether a test has been performed on the stepper 12. If so, execution proceeds to step 102, in which the test data generated by the stepper 12 is captured and then appended to an ASCII stepper file in step 104. In step 106, a determination is made whether a predetermined time period defining when the ASCII file is to be uploaded to the VAX drive 18 has expired. If so, execution proceeds to step 108, in which the ASCII stepper file is uploaded to and stored on the VAX drive 18, and then returns to step 101. If in step 101, it is determined that no test has been run, execution proceeds to step 108, in which a determination is made whether it is time to upload the file to the VAX drive 18. Similarly, if in step 106, it is determined that it is not time to upload the file, execution returns to step 101.

Figure 1D:
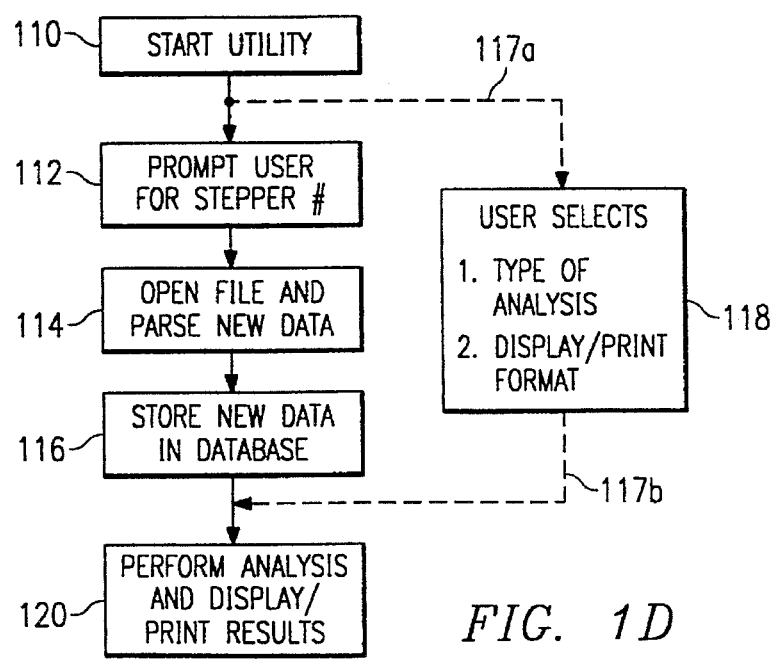
FIG. 1D is a flowchart of the operation of the system of the present invention for performing user-selected analyses on stepper data and printing and/or displaying analysis results in a user-selected format.

FIG. 1D is a flowchart of the operation of the utility 24 for performing user-selected analyses on user-selected data and printing or displaying analysis results in a user-selected format. in step 110, the utility 24 is initiated by a user at PC2. In step 112, the user is prompted to enter a stepper number corresponding to the stepper to be analyzed. In step 114, the utility 24 opens the appropriate stepper file and parses the new data contained therein. In step 116, the utility 24 stores the new data in a database stored on the VAX drive 18. At some point during the performance of steps 112, 114 and 116, as indicated by dashed lines 117a, 117b, in step 118, the user selects a type of analysis to be performed and a format in which the analysis results are to be printed and/or displayed. In step 120, the utility 24 performs the selected analysis and prints/displays the analysis results in the user selected format. As will be demonstrated in detail below, in a preferred embodiment, user-selection of analysis type and display/print format is performed via a graphical user interface for convenience and ease of operation.

Figure 2A:
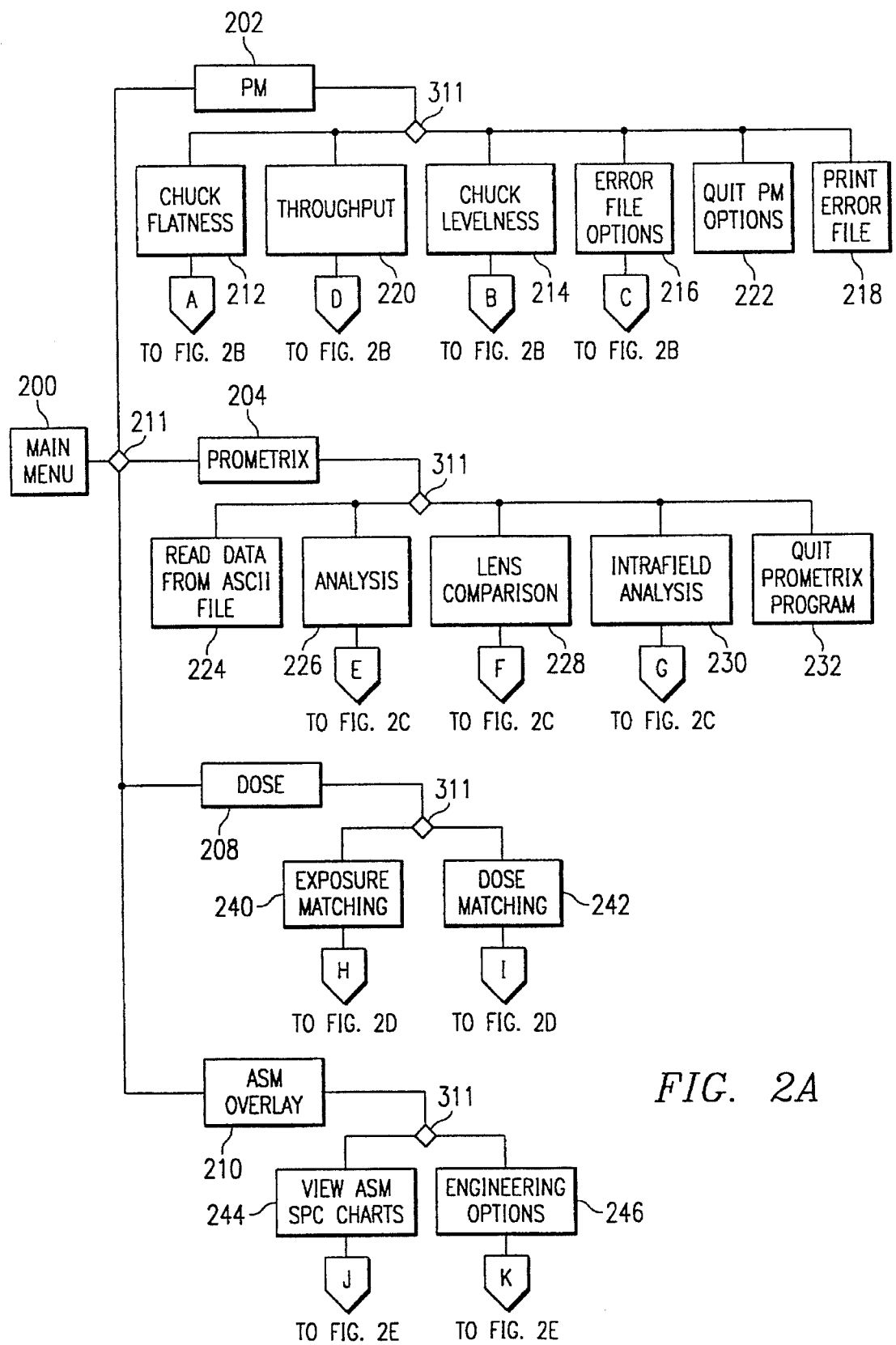
Figure 2B:
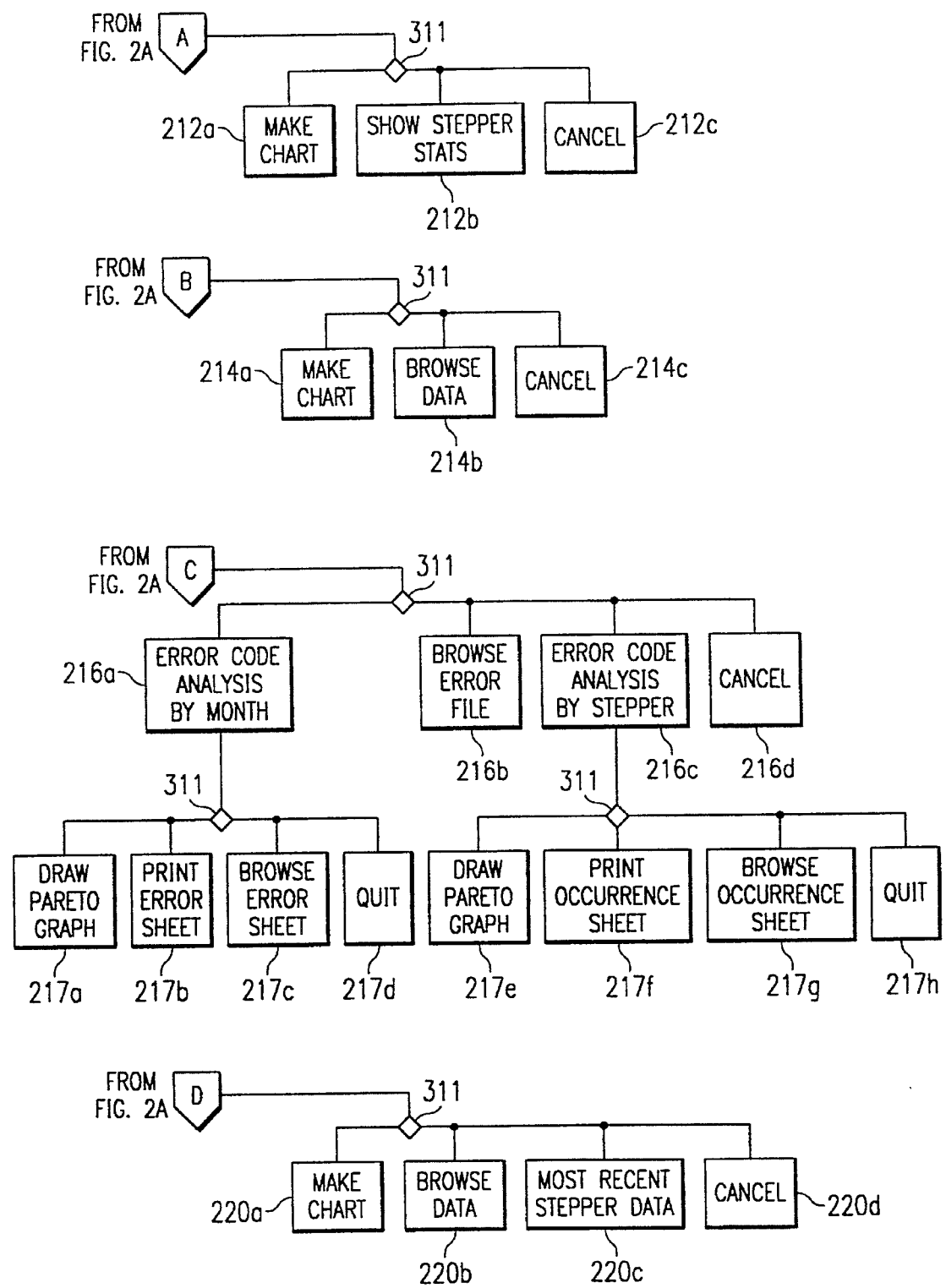
Figure 2D:
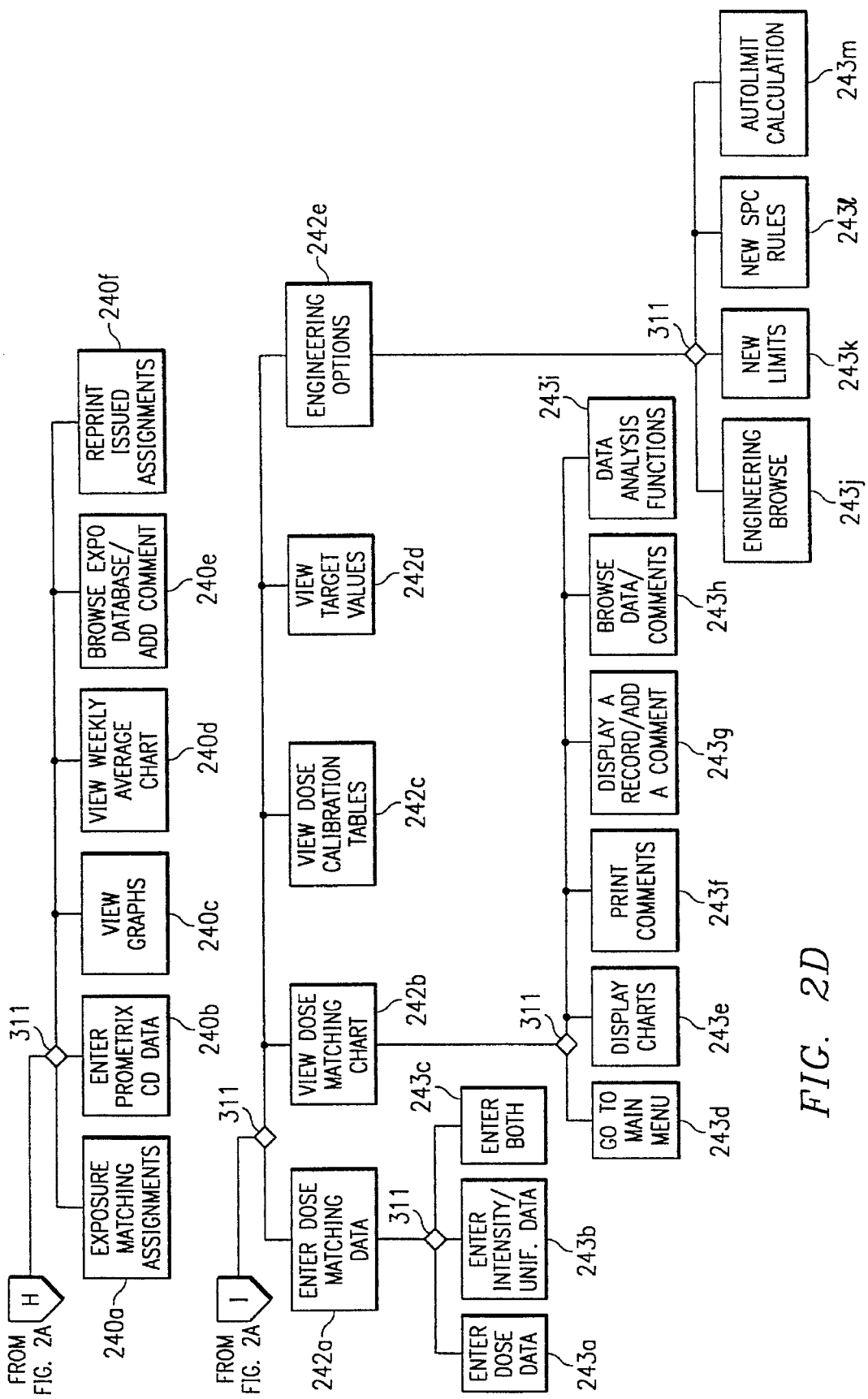

FIGS. 2A–2E illustrate an interface block diagram as a hierarchical illustration of the user interface options provided by a preferred embodiment of the utility 24. Upon initiation of the utility 24, a Main Menu of the present invention, as shown in FIG. 3 as it would appear to a user on PC2 upon initiation of the utility 24 and represented in FIG. 2A by a block 200, is displayed. From the Main Menu 200, the user may select one or more of several options for analyzing and displaying data from the stepper 12 and the EM1 22, including, in particular, a PM 202 option for analyzing the results of various preventive maintenance tests performed on the stepper 12, a Prometrix option 204 for analyzing the results of CD/linewidth tests performed using the EM1 device 22, a Dose option 208 for analyzing exposure matching and dose matching data, and an ASM Overlay option 210 for analyzing overlay data. It will be recognized that, as used in FIGS. 2A–2E, diamond shaped blocks 211 are used to denote points at which a user may select from among two or more available options, for example, from a menu displayed on the display 26.

Figure 4:
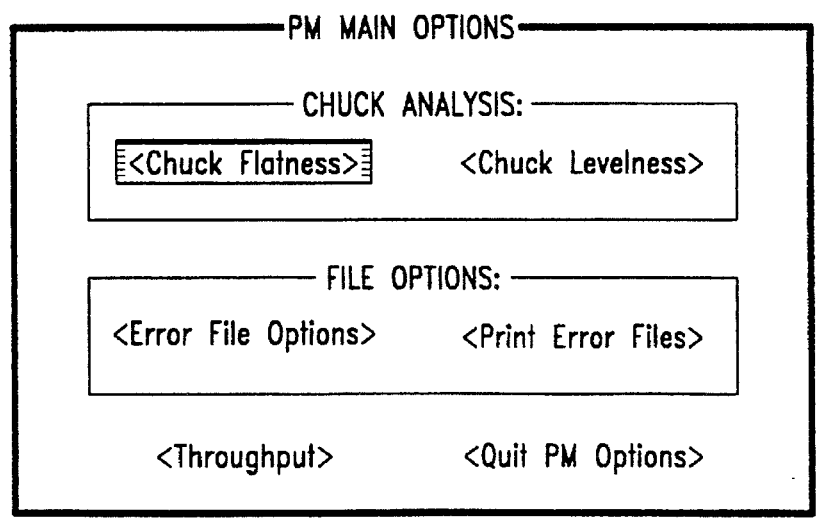
FIG. 4 illustrates a PM Main Options screen of the system of the present invention.
Figures 5, 6:
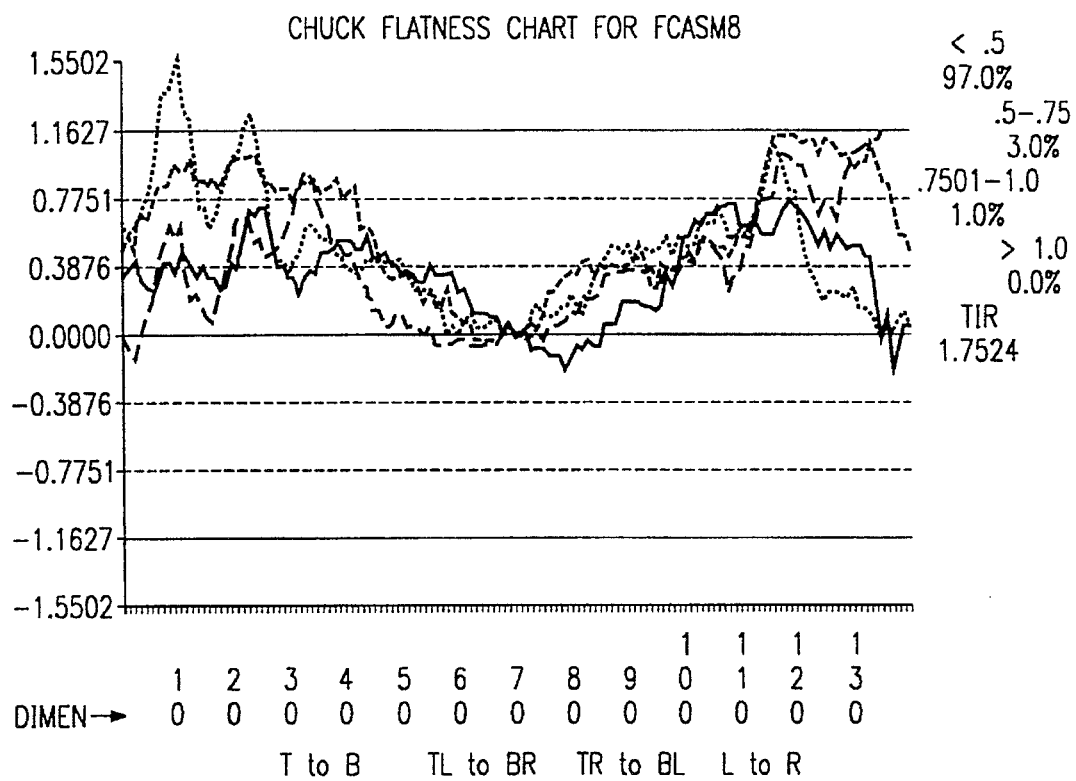
FIG. 5 illustrates a chuck flatness chart generated using the system of the present invention.
FIG. 6 illustrates a table showing the last chuck flatness data by stepper generated using the system of the present invention.

Assuming the user selects the PM option 202 to analyze results of certain preventive maintenance tests performed on the steppers, such as the stepper 12, a PM Main Options screen, as shown in FIG. 4, is displayed. Referring to FIGS. 2A–2E and 4, from the PM Main Options screen (FIG. 4), the user may select from among several options related to chuck analysis and error file options, including, in particular, a Chuck Flatness option 212, a Chuck Levelness option 214, an Error File option 216, a Print Error File option 218, a Throughput option 220, and a Quit PM Options option 222. User selection of the Chuck Flatness option 212 results in the user being prompted to select a stepper to be analyzed by entering the corresponding stepper number thereof, at which point, the user may select from among several additional options for viewing and analyzing chuck flatness data for the selected stepper, including a Make Chart option 212a, a Show Stepper Stats option 212b and a Cancel option 212c. Selection of the Make Chart option 212a results in the generation of a chuck flatness chart, such as that shown in FIG. 5, created from test results data generated by the user-selected stepper on a user-selected date. As shown in FIG. 5, the chuck flatness chart illustrates chuck height deviation (x axis) versus chuck radius (y axis) for a particular test run.

Referring again to FIGS. 2A–2E, selection of the Show Stepper Stats option 212b results in the automatic generation of a table comprising data from the latest test run for each stepper, as shown in FIG. 6. Finally, selection of the Cancel option 228 returns the user to the PM Main Options screen (FIG. 4).

As indicated above, selection of the Make Chart option 212a results in the generation of a chart, such as that illustrated in FIG. 5, showing the flatness of the exposure chuck of the selected stepper on the selected date across several diameters. In a preferred embodiment, chuck tilt is factored out of the raw data before the data is graphed as shown in FIG. 5.

As also indicated above, selection of the Show Stepper Stats option 212b results in the generation of a table of the last chuck flatness data for each stepper, as shown in FIG. 6. This table enables the user to view the results of the latest chuck flatness test for every stepper in the fab simultaneously. By selecting a print data option associated with the table, the user may print the entire table on a printer connected to PC2.

Figure 7:
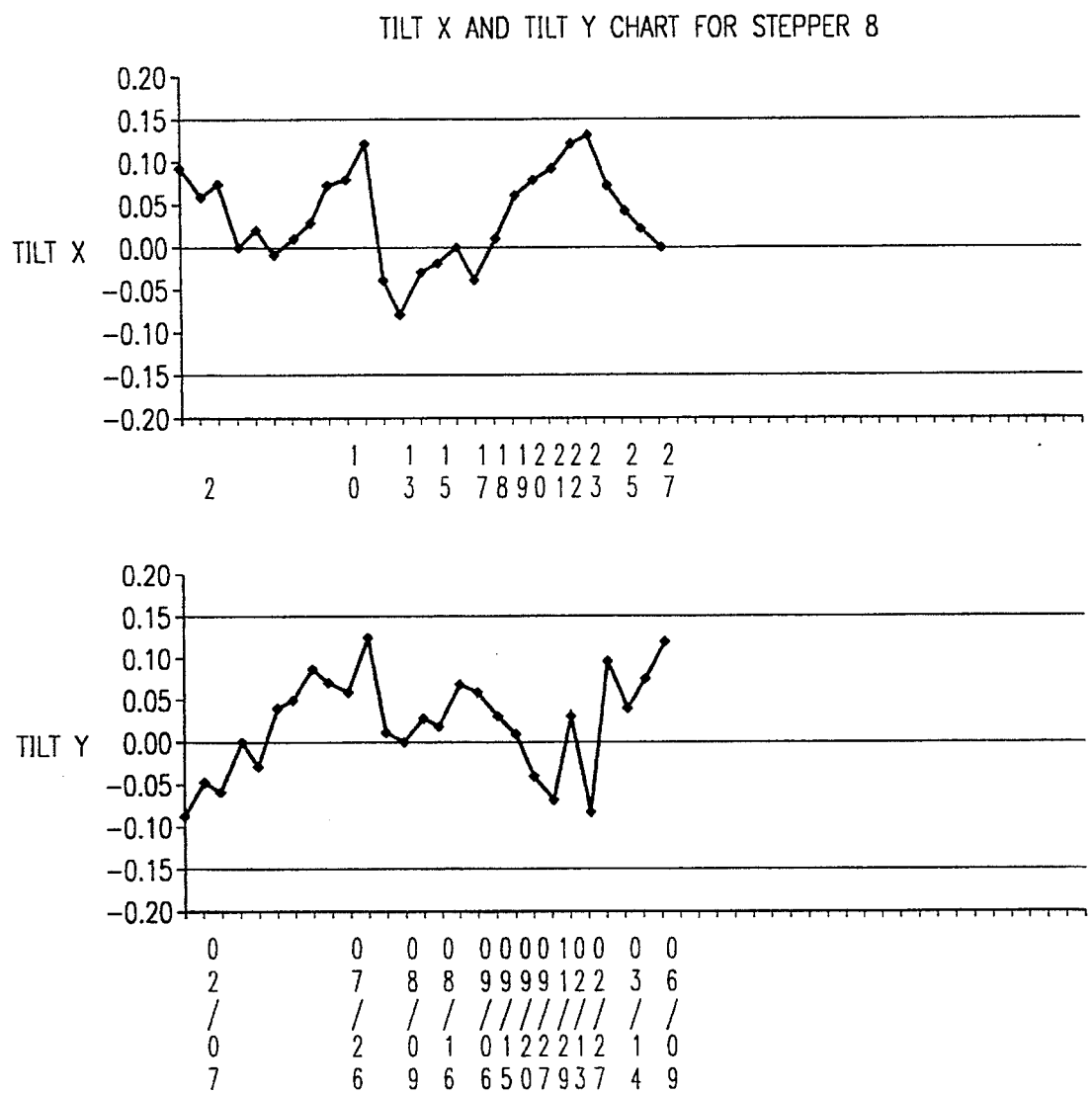
FIG. 7 illustrates a chuck levelness chart generated using the system of the present invention.

Referring again to the FIGS. 2A–2E and 4, selection of the Chuck Levelness option 214 from the PM Main Options screen (FIG. 4) results in the user being prompted to select a stepper by number, at which point the user is provided with several additional options for viewing and analyzing chuck levelness data. For example, the user may select a Make Chart option 214a (FIG. 2B) to create a graph of X and Y tilts for a stepper selected in response to an "Enter Stepper Number" prompt, as shown in FIG. 7, a Browse Data option 214b (FIG. 2B) to browse chuck levelness data for the selected stepper, or a Cancel option 214c (FIG. 2B) to return to the PM Main Options screen (FIG. 4).

Chuck levelness is one of the factors that result in loss of depth of focus, which in turn results in ICs of unacceptably low quality. The effect of this can be minimized by a user's running a chuck levelness test, analyzing the data using functions provided under the Chuck Levelness option 214 and then adjusting the chuck accordingly. As indicated above, FIG. 7 illustrates a tilt X and tilt Y chart for a particular stepper with respect to chuck levelness.

During operation of the stepper, the occurrence of various types of errors are logged in an error file associated with the stepper. Referring again to FIGS. 2A–2E, selection of an Error File Options option 216 (FIG. 2A) from the PM Main Options screen (FIG. 4), enables the user to select from several options for displaying and analyzing errors. For example, the user may select an Error Code Analysis by Month option 216a (FIG. 2B) to evaluate stepper errors for a selected stepper by month., a Browse Error File option 216b (FIG. 2B) to browse an error file for a selected stepper on a selected date, an Error Code Analysis by Stepper option 216c (FIG. 2B) to evaluate stepper errors by stepper, and a Cancel option 216d (FIG. 2B) to return to the PM Main Options screen (FIG. 4).

Figure 8:
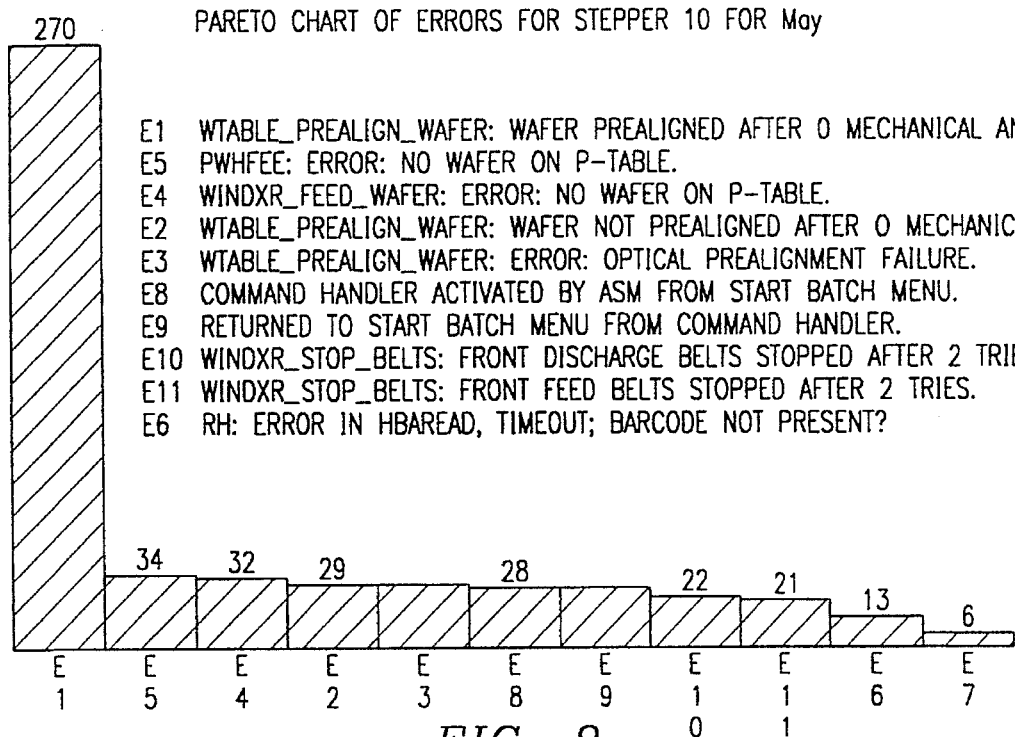
FIG. 8 illustrates a pareto graph of errors for a selected stepper generated using the system of the present invention.

Selection of the Error Code Analysis by Month option 216a results in the user being prompted to select a stepper and a month, at which point the user is provided several format options for displaying the error data. For example, selection of a Draw Pareto Graph format option 217a results in the creation of a pareto chart of the most frequently occurring errors for the selected stepper in the selected month as recorded by the stepper's error logging system. An example of a pareto chart created using the Draw Pareto Graph format option 217a is shown in FIG. 8. Selection of a Print Error Sheet format option 217b prints an error sheet, such as that shown in FIG. 9, comprising a list of all errors for the selected stepper in the selected month, including percentages of total errors comprised by each error. Selection of a Browse Error Sheet format option 217c displays and permits a user to scroll through the error sheet (FIG. 9). Finally, selection of a Quit option 217d returns the user to the Error File Options option 216 (FIG. 2A).

Figure 10:
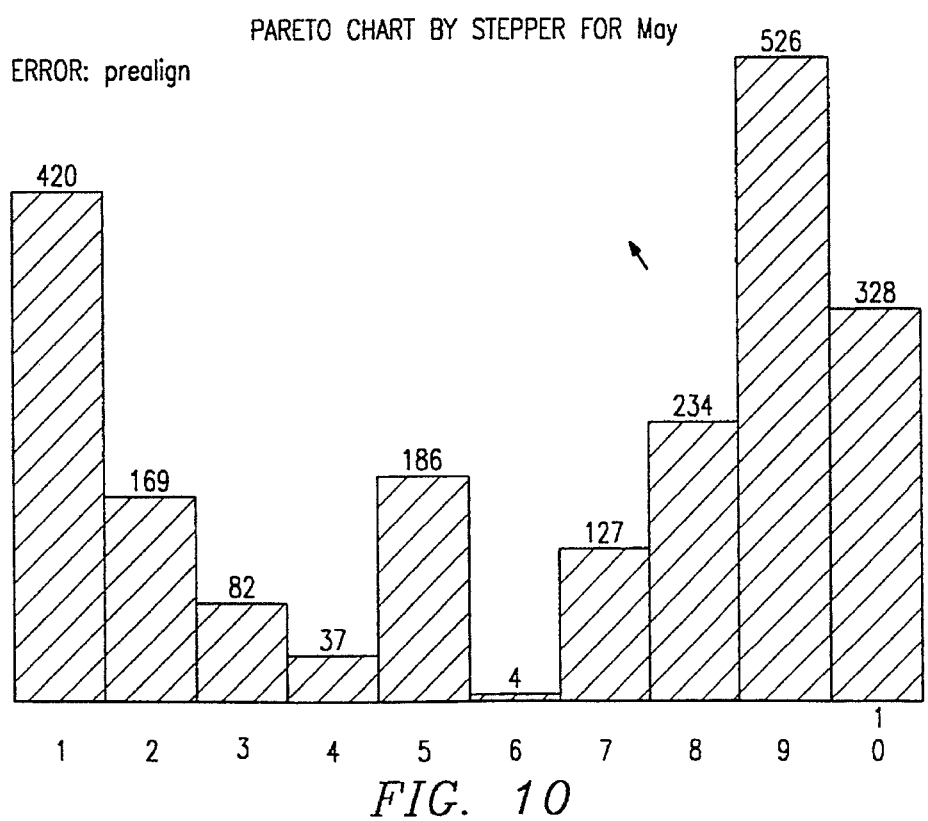
FIG. 10 illustrates a pareto graph of a selected error by stepper for a particular month generated using the system of the present invention.
Figures 11, 12:
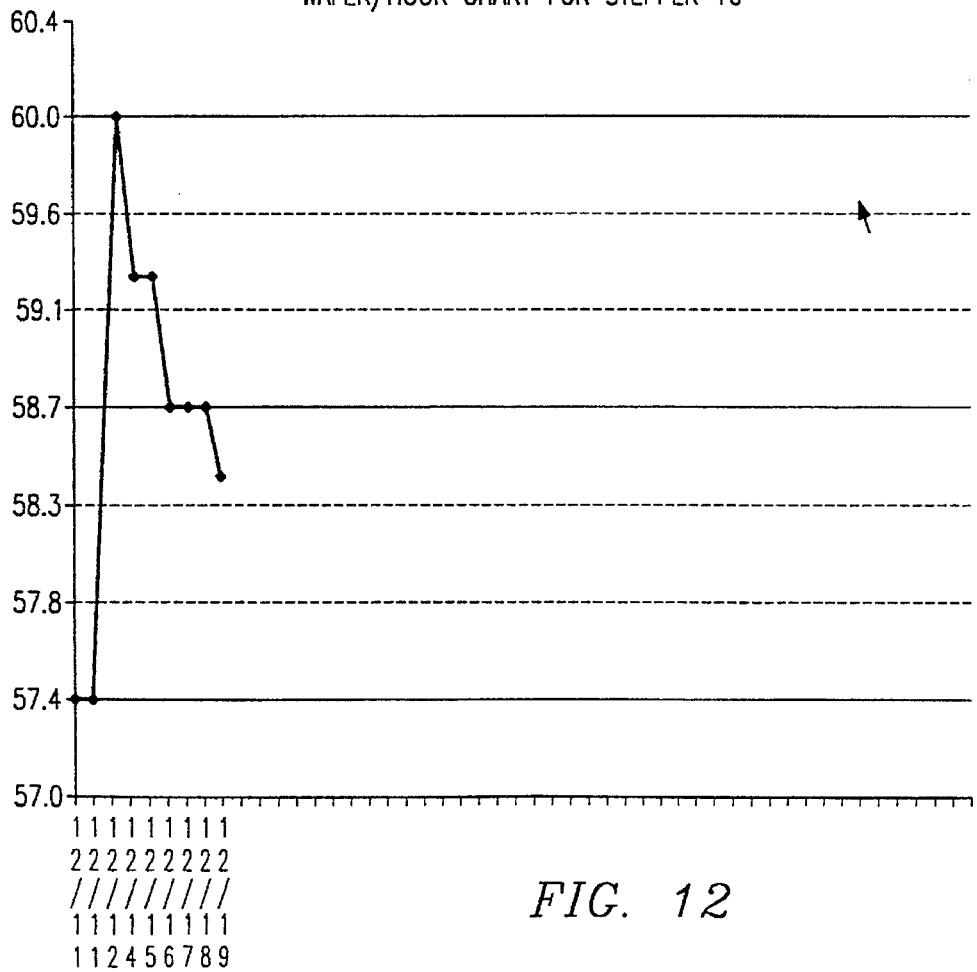
FIG. 11 illustrates an error code occurrence sheet for a selected error by stepper generated using the system of the present invention.
FIG. 12 illustrates a wafer/hour chart for a given exposure and number of exposures generated using the system of the present invention.

Referring again to FIG. 2B, selection of the Browse Error File function 216b enables the user to browse an error file of a selected stepper for a selected date. Selection of the Error Code Analysis By Stepper function 216c results in the user being presented with additional options for analyzing and viewing stepper errors. In particular, the user is prompted to enter an error or substring thereof to be searched for, a range of dates in which to search and a display/print format option. Once the user has entered the necessary information, selection of a Draw Pareto Graph format option 217e results in the generation of a pareto graph showing the occurrence of the selected error by stepper over the selected time period, as shown in FIG. 10. For example, the pareto graph of FIG. 10 illustrates the number of times each of steppers 1–10 (not shown) experienced a "prealign" error during the month of May. Selection of a Print Occurrence Sheet format option 217f or a Browse Occurrence Sheet option 217g results in the generation of an error code occurrence sheet, as shown in FIG. 11, which contains the same information, albeit in a different format, as the pareto graph of FIG. 10. Selection of a Cancel option 217h returns the user to the Error File Options option 216 (FIG. 2A).

Finally, referring again to FIG. 2B, selection of the Cancel option 216d returns the user to the PM option 202 (FIG. 2A) and the PM Main Options screen (FIG. 4). Referring again to FIGS. 2A–2E and 4, selection of the Print Error File option 218 prints the error file associated with a user-selected stepper. Selection of the Throughput option 220 results in the user being prompted to enter a stepper number, after which the user may select a Make Chart option 220a (FIG. 2B) to graph throughput values, in units of wafers per hour, for the selected stepper, as shown in FIG. 12, a Browse Data option 220b (FIG. 2B) to browse PM records (not shown) for the selected stepper, a Most Recent Stepper Data option 220c (FIG. 2B) to generate a table comprising the last throughput data for each stepper, as shown in FIG. 13, which allows the user to identify the least and most productive stepper so the user can determine the causes behind the lack of production, and a Cancel option 220d (FIG. 2B) to return to the PM option 202 (FIG. 2A) and the PM Main Options screen (FIG. 4). From the PM option 202, user selection of the Quit PM Options option 222 from the PM Main Options screen (FIG. 4) returns the user to the Main Menu 200.

Referring again to the Main Menu 200, as shown in FIG. 3, user selection of the Prometrix option 204 results in the display of a Main Screen For Prometrix Analysis, as shown in FIG. 14. From the Main Screen For Prometrix Analysis, the user may select one of several options for performing CD/linewidth analysis, including a Read Data From ASCII File option 224, an Analysis option 226, a Lens Comparison option 228, an Intrafield Analysis option 230, and a Quit Prometrix Program option 232. In particular, the EM1 device 22 is used to measure CD/linewidth of a wafer that has been stepped using a particular stepper. The resulting data may be used to analyze the accuracy of the stepper.

User selection of the Read Data From ASCII File option 224 (FIG. 2A) reads data from a Prometrix file generated by the EM1 22 containing CD/linewidth data for the selected stepper. In a particular embodiment, Prometrix files are stored in databases on the VAX drive 18 according to CD size and geometry. For example, a database denoted "P50HI" corresponds to 0.5 CD size and horizontal isolated geometry.

User selection of the Analysis option 226 (FIG. 2A) results in the user being prompted to enter the number of a stepper to be graphed or browsed, a sigma value, CD size (in microns), structure type and the date the test was run. At that point, the user may select from among several additional options with respect to viewing and analyzing the EM1 data. For example, selection of a Browse Stepper Table option 226a (FIG. 2C) results in the user being further prompted to select one of several parameters, including Average 227a, Range 227b, Uniformity 227c, Min 227c, Max 227e, and Number of Good Points 227f, to be graphed. After the user has selected a parameter, a table for the selected parameter, as shown in FIG. 15 is displayed. At that point, the user may print the table by selecting a Print option 227g associated with the table or return to the Browse Stepper Table option 226a by selecting a Return option 227h.

Figures 16, 17:
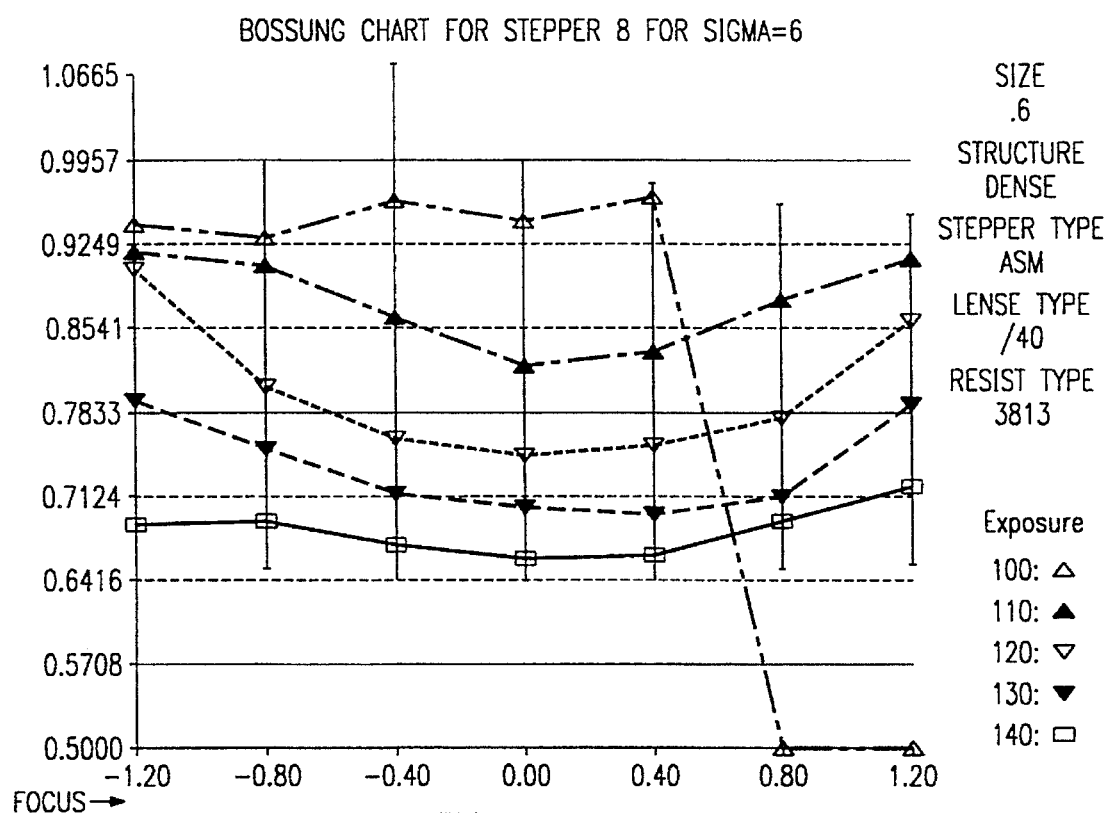
FIG. 16 illustrates a bossung chart for a particular stepper and sigma value generated using the system of the present invention.
FIG. 17 illustrates a difference of averages table generated using the system of the present invention.
Figure 18:
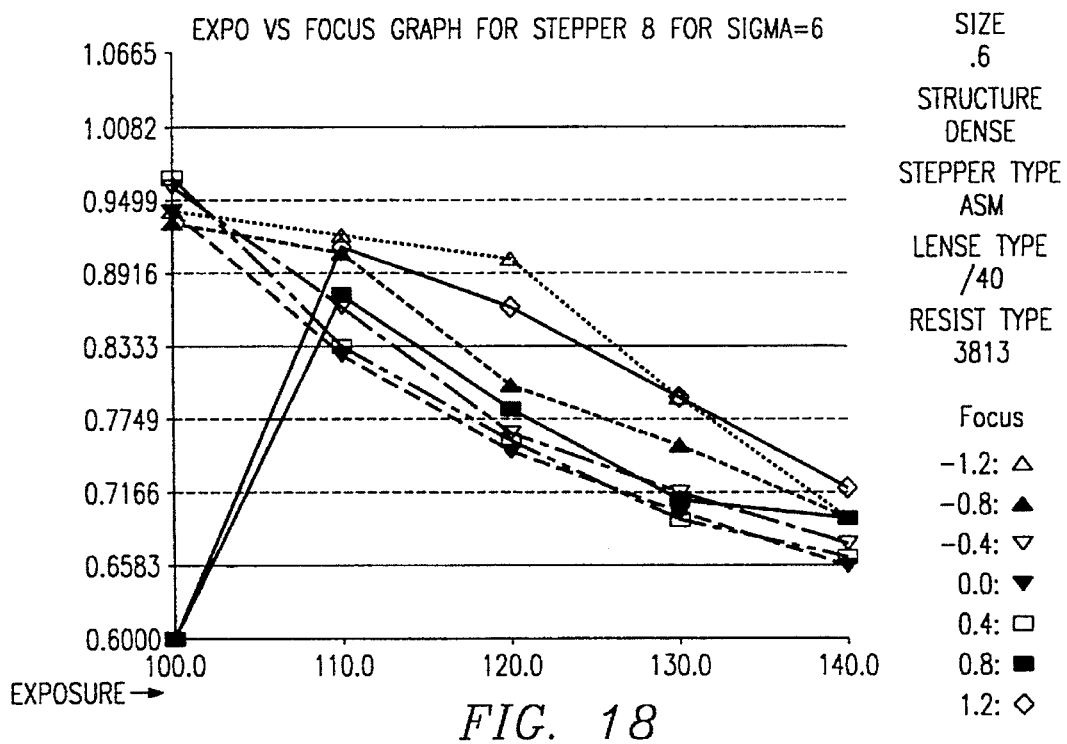
FIG. 18 illustrates an exposure vs. focus graph for a particular stepper and sigma value generated using the system of the present invention.

Referring again to the Analysis option 226 (FIG. 2A), user selection of a Draw Bossung Graph option 226b (FIG. 2C) generates a bossung graph for using the designated inputs, such as that shown in FIG. 16. The bossung graph (FIG. 16) allows the user to identify the best focus, view the focus and exposure latitudes, and identify the iso-focal tilt. Referring again to the Analysis function 226, user selection of a Browse Astigmatism Data option 226c (FIG. 2C) permits the user to identify and qualify astigmatism. When an astigmatism is identified, an engineer can act to correct the problem, for example, by adjusting the illumination source or replacing the lens. Selection of a Difference of Averages option 226d (FIG. 2C) from the Analysis option 226 (FIG. 2A) results in the generation of a Difference Of Averages screen, such as that shown in FIG. 17, comprising a table of the differences in values between each focus and exposure step; that is, the CD variance from exposure to exposure. This table can be printed by selecting a Print option associated with the Difference of Averages table. User selection of an Expo. vs. Focus Graph format option 226e (FIG. 2C) generates an exposure vs. focus graph, as shown in FIG. 18. The exposure vs. focus graph allows the user to determine what type of CD versus exposure slope occurs for different focuses to help evaluate resist processes. Finally, selection of a Cancel option 226f (FIG. 2C) returns the user to the Prometrix option 204 (FIG. 2A) and the Main Screen For Prometrix Analysis (FIG. 14).

Figure 19:
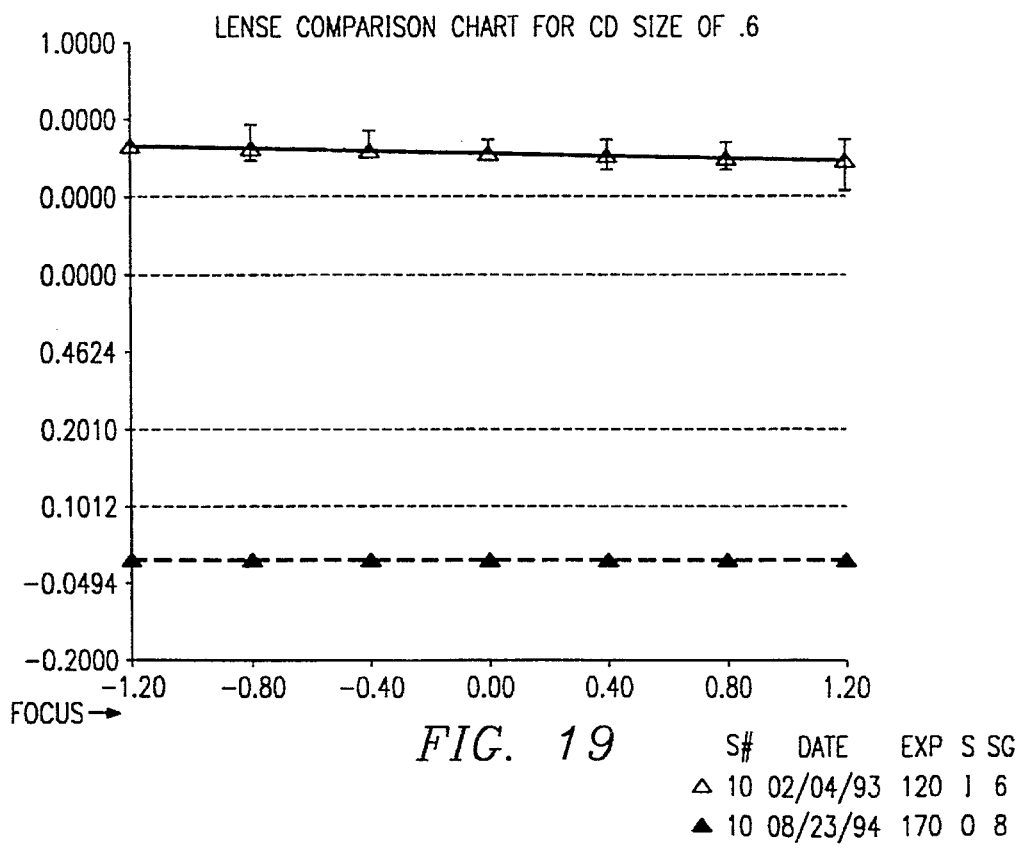
FIG. 19 illustrates a lens comparison chart for a particular CD size generated using the system of the present invention.

Selection of the Lens Comparison option 228 (FIG. 2A) from the Main Screen for Prometrix Analysis (FIG. 14) results in the user being prompted to select a CD size, as well as a stepper, date, exposure, structure and sigma value, to view. Once values have been selected for all variables, selection of a Make Chart option 228a (FIG. 2C) results in the generation of a lens comparison chart, such as that shown in FIG. 19. The lens comparison chart (FIG. 19) enables the user to compare different lenses at similar CD/exposure settings, as well as to view and compare different resist products and processes. Typically the user will specify variables for a series of different runs to be graphed together, as shown in FIG. 19. Selection of a Cancel option 228b (FIG. 2C) returns the user to the Prometrix option 204 (FIG. 2A) and the Main Screen For Prometrix Analysis (FIG. 14).

Figures 20, 21:
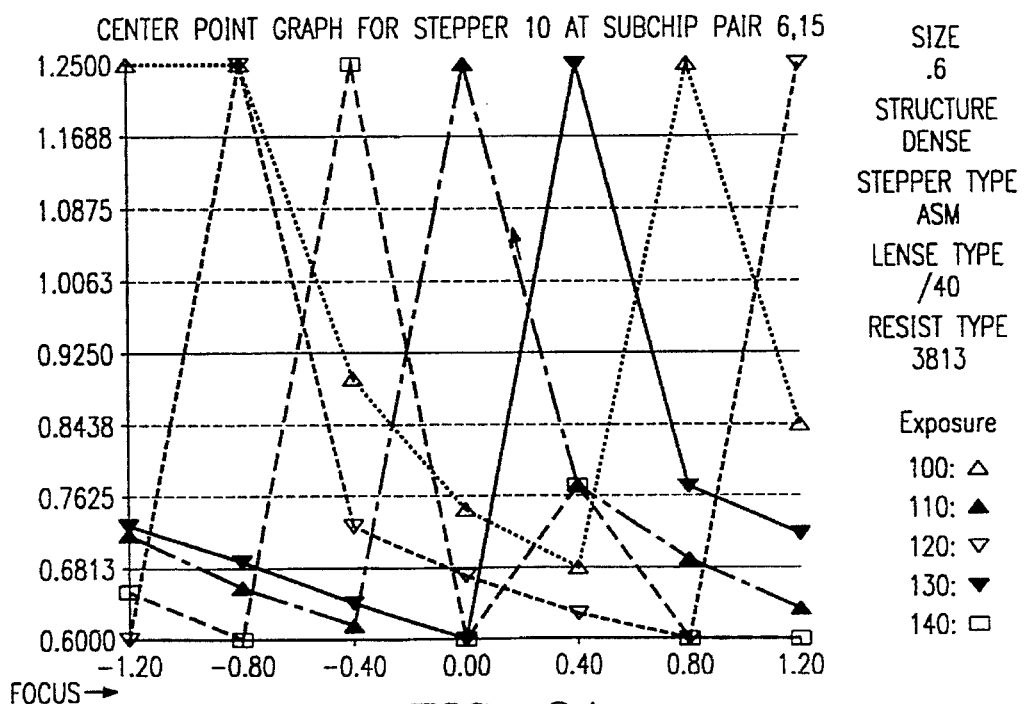
FIG. 20 illustrates depth of focus analysis results generated using the system of the present invention.
FIG. 21 illustrates a center point graph for a particular stepper at a designated subchip pair generated using the system of the present invention.

Selection of an Intrafield Analysis option 230 (FIG. 2A) from the Main Screen For Prometrix Analysis (FIG. 14) results in the user being prompted to enter values for several variables, including CD size, stepper number, structure, date, exposure and focus, at which point the user is given several options with respect to the format of the desired intrafield analysis. Thereafter, selection of a Depth of Focus option 230a (FIG. 2C) results in the generation of a table of data that the averages and the depth of focus for the given exposure and focus value for the selected stepper, as shown in FIG. 20. Specifically, after the user has selected a focus range, the system of the present invention calculates the number of points in that range and the average, range and standard deviation of the data in the specified range. This allows for consistency in determining the depth of focus for a particular stepper. Returning to the Intrafield Analysis Options option 230, selection of a Center PG Graph option 230b (FIG. 2C) generates a Center Point Graph, such as that shown in FIG. 21, at a given exposure and focus for a given site. Specifically, based on a selected subchip pair, the Center Point Graph (FIG. 21) displays CD values within the site for each exposure and focus location. The Center Point Graph (FIG. 21) is used to determine the best focus at any particular site within a field.

Figure 22:
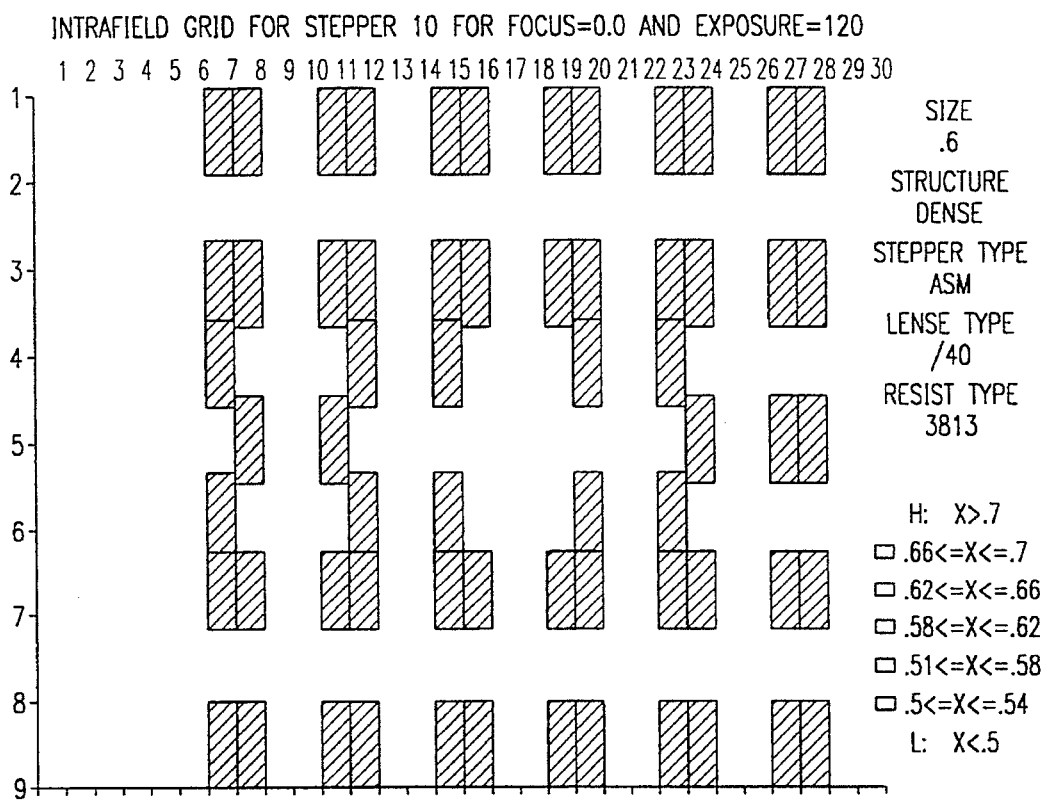
FIG. 22 illustrates an intrafield CD grid of raw site data at a specific exposure for a particular stepper, focus value and exposure value generated using the system of the present invention.

Referring again to the Intrafield Analysis Option 230 selection of a Draw Grid format option 230c (FIG. 2C) results in the generation of an intrafield CD grid, such as that shown in FIG. 22, which enables the user to evaluate CD variation across the field and identify focal plane problems and potential hot and cold spots in the illumination system. In the preferred embodiment, the boxes are color- and letter-coded to visually indicate where the average CD measurement for the site falls. Returning once more to the Intrafield Analysis Option option 230, selection of a Cancel option 230d (FIG. 2C) returns the user to the Main Screen For Prometrix Analysis (FIG. 14).

Figure 23:
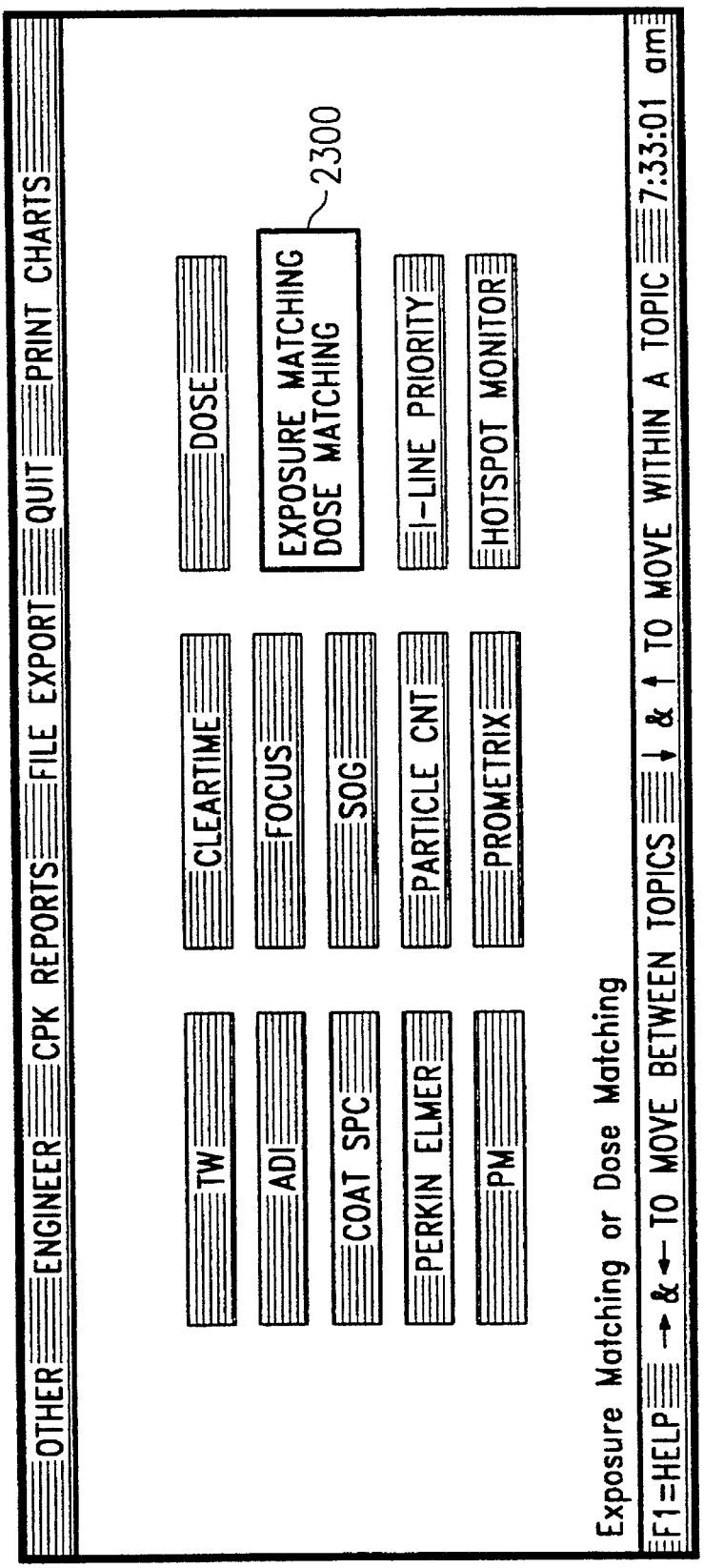
FIG. 23 illustrates an Exposure Matching or Dose Matching screen of the system of the present invention.

Selection of the Quit Prometrix Program option 232 from the Main Screen For Prometrix Analysis (FIG. 14) returns the user to the Main Menu 200 (FIG. 2A), as shown in FIG. 3. From the Main Menu option 200, selection of the Dose option 208 results in the display of an Exposure Matching/Dose Matching window 2300, as shown in FIG. 23. From the Exposure Matching/Dose Matching window 2300 (FIG. 23), selection of an Exposure Matching option 240 (FIG. 2A) provides the user with several additional options, including, as shown in FIG. 2D, an Expo Matching Assignments option 240a, an Enter Prometrix CD Data option 240b, a View Graphs option 240c, a View Weekly Average Chart option 240d, a Browse Expo Database/Add Comments option 240e, and Reprint Issued Assignments option 240f.

The Exposure Matching Assignments option 240a (FIG. 2d) enables the user to identify steppers that are printing high or low CDs. The assignment identifies the row of a test wafer across which the stepper is to expose the die. One wafer will be used for all G-line steppers and another wafer for all I-line steppers. After the wafer has gone through all of the I-line or G-line steppers, the EM1 22 is used to measure the CDs exposed on the wafer. Because CDs on certain parts of the wafer will systematically measure high or low, the row a stepper across which the steppers are caused to expose the die is rotated to eliminate such systematic errors and enable the user to identify the stepper or steppers that vary from the CD mean.

FIGS. 24A and 24B show a printout generated using the Exposure Matching Assignments option 240a. Each time an assignment is given, the row indicated next to each stepper number will increase by one letter, and the one with the highest row letter will start again with the first row in the series.

Referring again to FIG. 2D, selection of the Enter Prometrix CD Data option 240b results in the user being prompted to enter a stepper type (i.e., I-line or G-line) and an assignment against which to enter data. Entry of this information results in the user being prompted to enter the date of the assignment. Once the user has entered all of the requested information, including date, operator number and TEGAL number, an assignment table, such as the one shown in FIG. 25. At this point, the user is prompted to enter values for CD average and lamp hour, as well as any comments, into the table. The CD average values are then averaged and stored in a database that stores the average CD per assignment.

Figure 26:
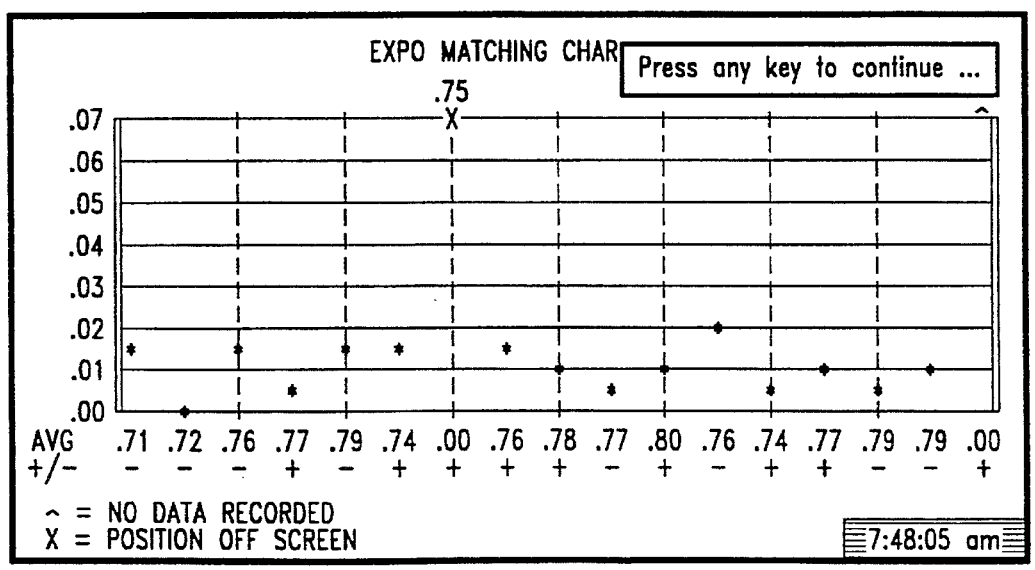
FIG. 26 illustrates an Expo Matching CD Chart generated by the system of the present invention.

Referring again to FIG. 2D, selection of a View Graphs option 240c results in the user being prompted to enter a stepper number. Once a stepper number has been entered, an Expo Matching Chart, as shown in FIG. 26, is displayed. Referring to FIG. 26, values along the x-axis represent the CD average for the assignment. The plus/minus sign indicates whether the stepper's CD average is below or above the average for the assignment. Values along the y-axis indicates a range of delta values between the individual stepper's CD value and the average CD for the assignment. For example, for the first point on the graph shown in FIG. 26, the individual CD value of the stepper is (0.71–0.15), or 0.56. The dashed line across the graph indicates a target range for the CD values.

Figures 27A, 27B:
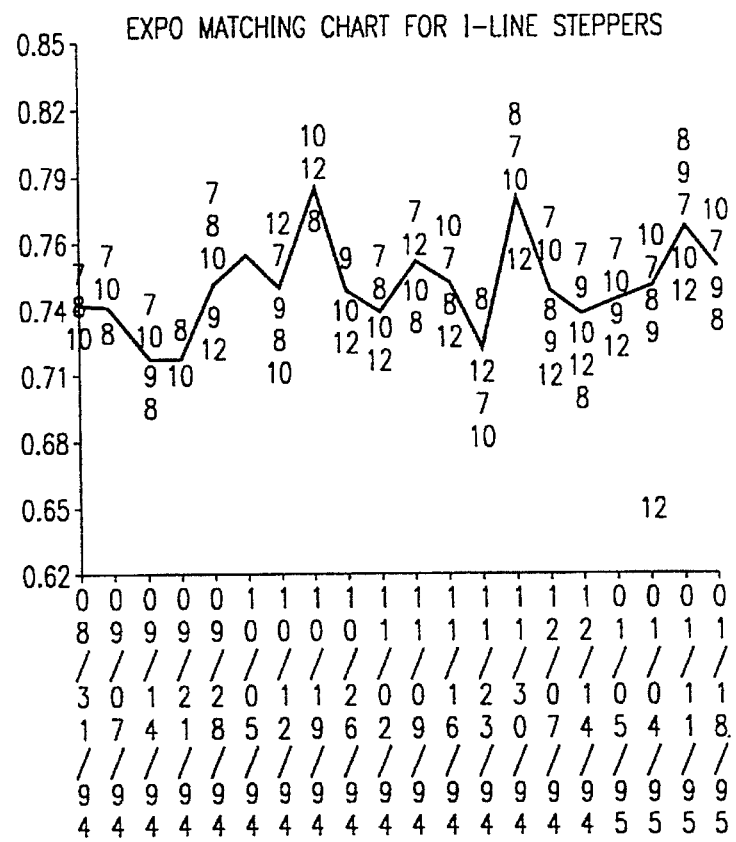
FIGS. 27A and 27B illustrate Expo Matching Charts for I-line and G-line steppers, respectively, generated using the system of the present invention.

Referring again to FIG. 2D, selection of a View Weekly Average Chart option 240d results in the user being prompted to select a type of stepper (i.e., I-line or G-line) for which data is to be displayed. Once the user has selected a stepper type, expo matching charts, such as those shown in FIGS. 27A and 27B for I-line and G-line steppers, respectively, are generated. The graphs shown in FIGS. 18A and 18B give a visual indication of the average CD for a given assignment for a day, as well as the relation between the individual stepper CD values and the CD average. Each individual stepper is denoted in the chart by its number. In a preferred embodiment, the user can change the Y-axis value range to generate charts showing more distinct values.

Referring again to FIG. 2D, selection of a Browse Expo Database/Add Comments option 240e and a Reprint Issued Assignments option 240f enables the user to browse and edit the Expo database and reprint old assignments, respectively.

Referring again to FIG. 2A, selection of a Dose Matching option 242 results in the user being presented with several additional dose matching options, as shown in FIG. 2D. Specifically, selection of an Enter Dose Matching Data option 242a results in the user being prompted to enter a stepper number. Upon entry of a stepper number, the user is prompted to select from among several types of data options, including a Dose Data option 243a, an Intensity/Uniformity Data option 243b or a combined option 243c. In particular, responsive to selection of the combined option 243c, the user is prompted to input the following data: operator number, pre-dose energy, post-dose energy, intensity, uniformity, energy conversion number, lamp hours and probe number. Pre-dose and post-dose energy are used to determine how well the system is controlling dose and where dose was after calibration Intensity and uniformity data is collected to determine whether there was a correlation between those parameters and dose fabrication. Energy conversion is used to calibrate the dose linearity. Lamp hours are the number of lamp hours left on the lamp's useable life. Probe number is used to identify the probe used to measure the energy during dose calibration and is tracked for calibration purposes. Once all the above data has been entered, a Pre/Post Dose Chart and an Intensity/Uniformity Chart, as shown in FIGS. 28A and 28B, respectively, are generated and displayed.

Figure 28A:
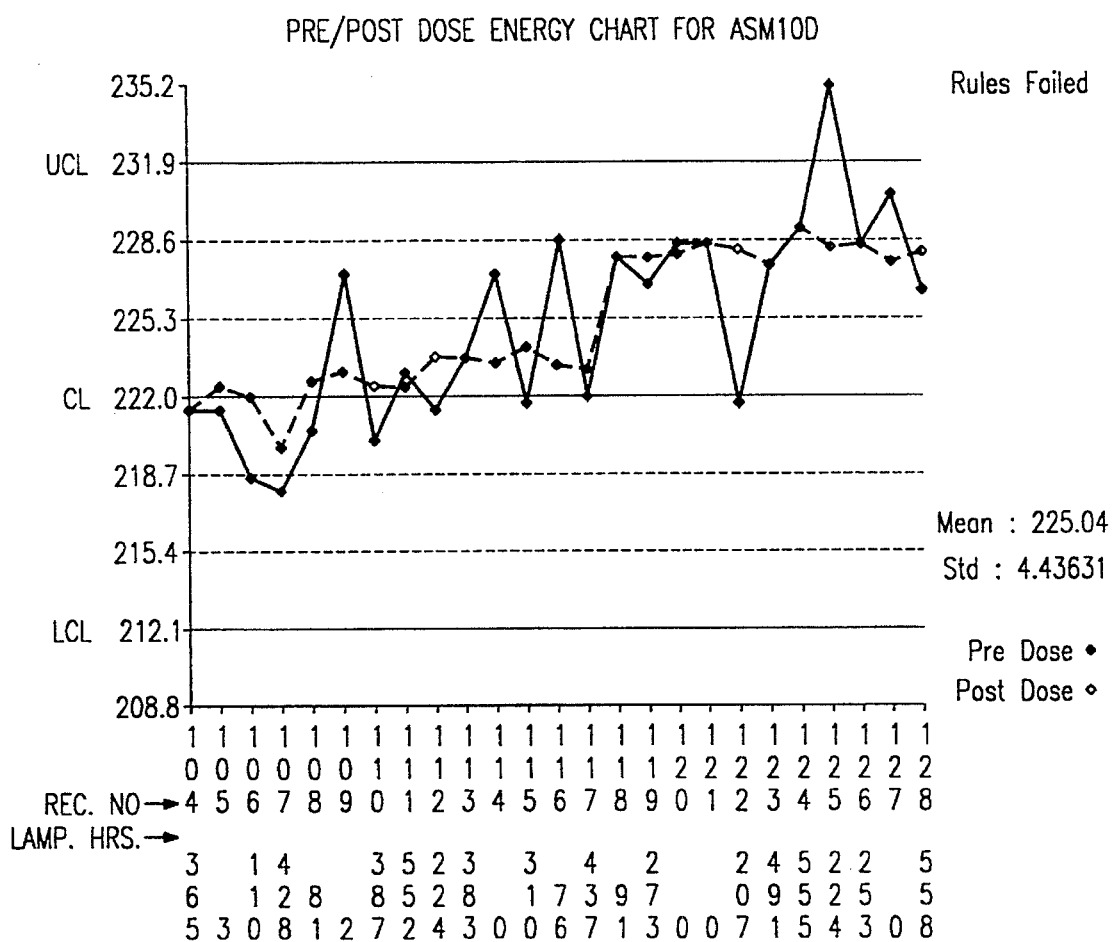
FIG. 28A illustrates a Pre/Post Dose Energy chart generated by the system of the present invention.
Figure 28B:
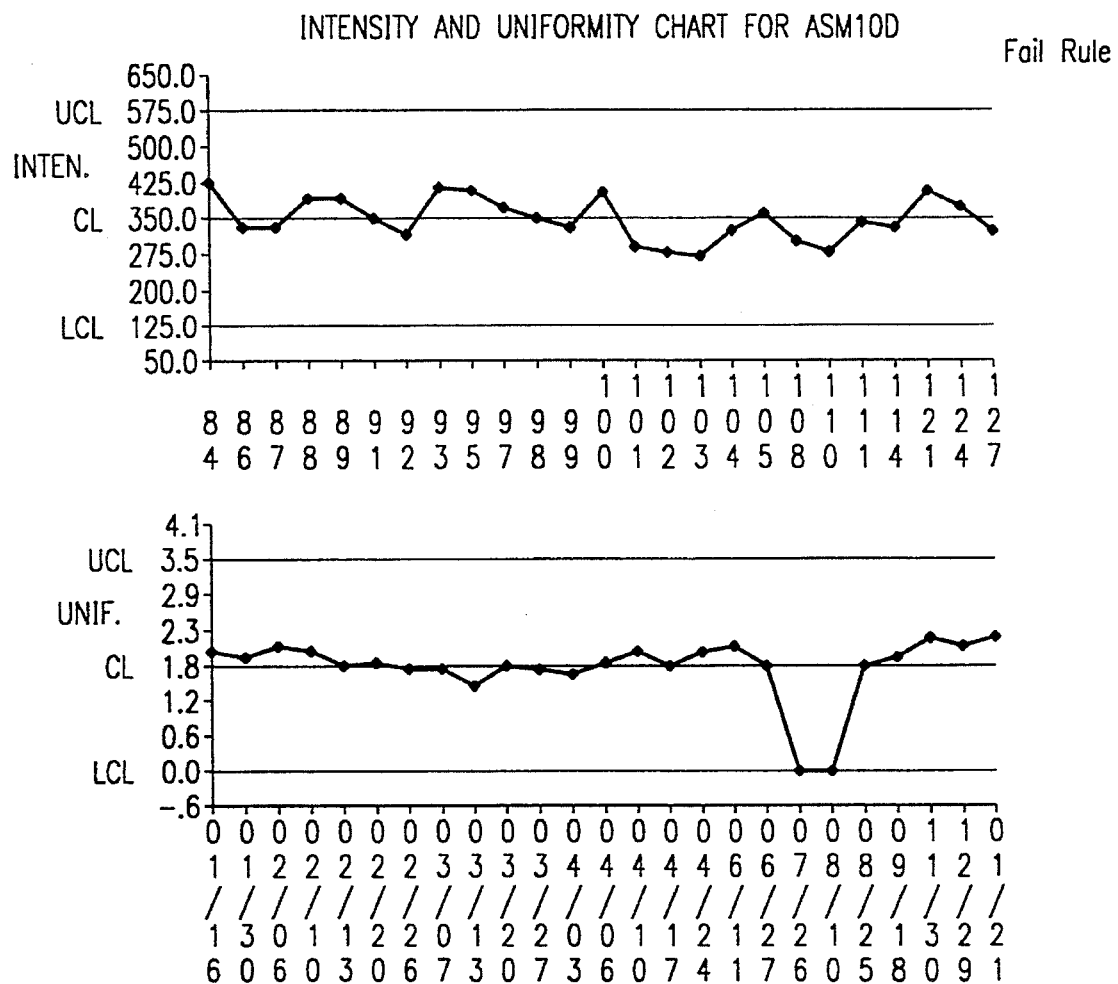
FIG. 28B illustrates an Intensity and Uniformity chart generated by the system of the present invention.

Selection of a View Dose Matching Chart option 242b (FIG. 2D) provides the user with additional options, including a Go To Main Menu option 243d for returning the user to the Dose Matching option 242, a Display Charts option 243e for displaying the charts shown in FIGS. 28A and 28B, a Print Comments option 243f for printing records that have comments attached, a Display a Record/Add a Comment option 243g for displaying the values and comments of a single record, a Browse Data/Comments option 243h for displaying a browse screen of the stepper's database, and a Data Analysis Functions option 243i for creating "Estimated Weighted Moving Average" ("EWMA") charts.

Figure 29:
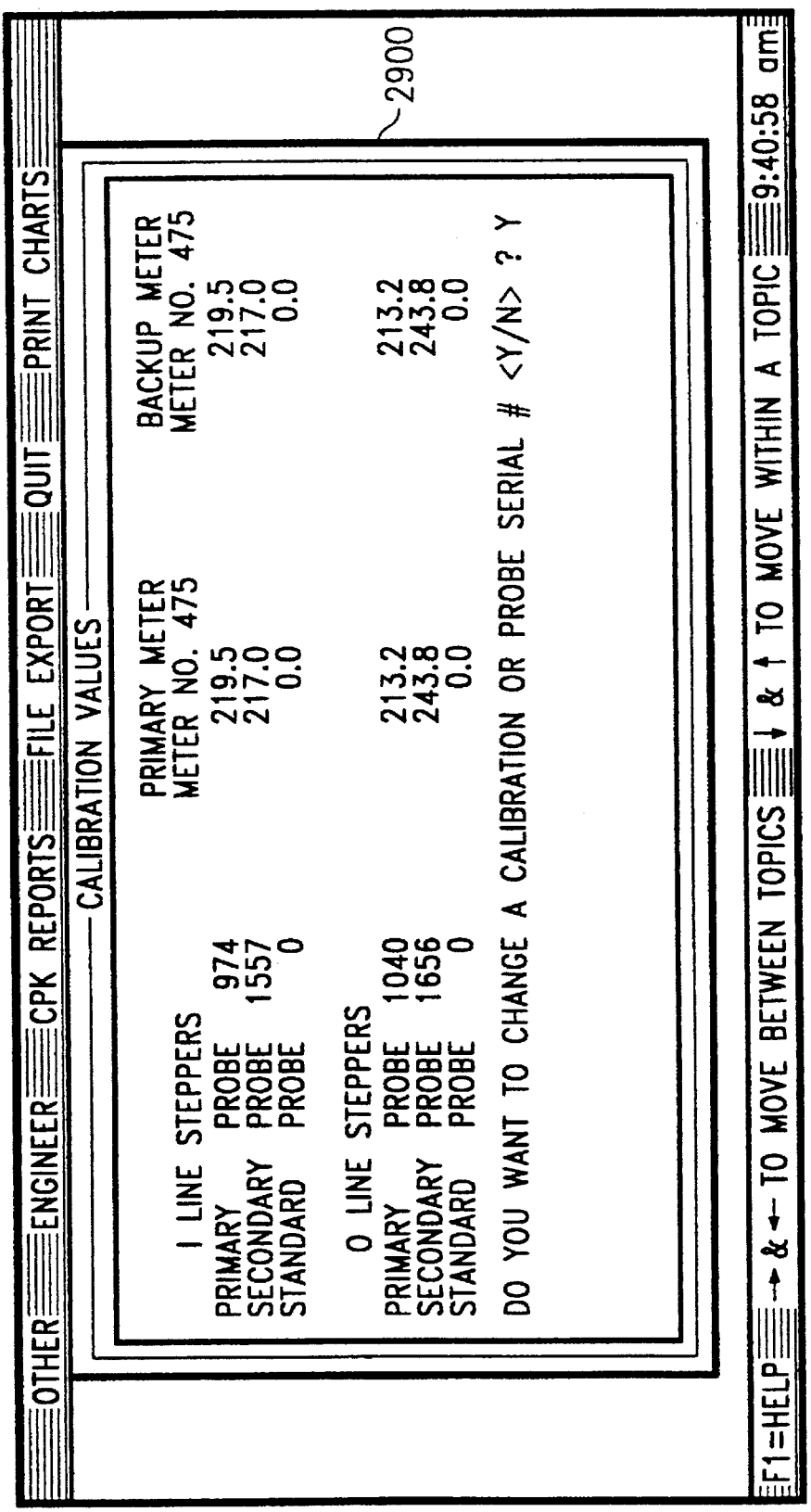
FIG. 29 illustrates a Calibration Values window of the system of the present invention.

Referring again to the Dose Matching option 246 (FIG. 2A), selection of View Dose Calibration Table option 242c (FIG. 2D) results in the display of a Dose Calibration table 2900, as shown in FIG. 29. The Dose Calibration table 2900 provides the user with a visual means of tracking different calibration values and serial numbers of the probes used on the different classes of steppers (i.e., I-line and G-line). The user can change the calibration numbers associated with each probe.

Figure 30:
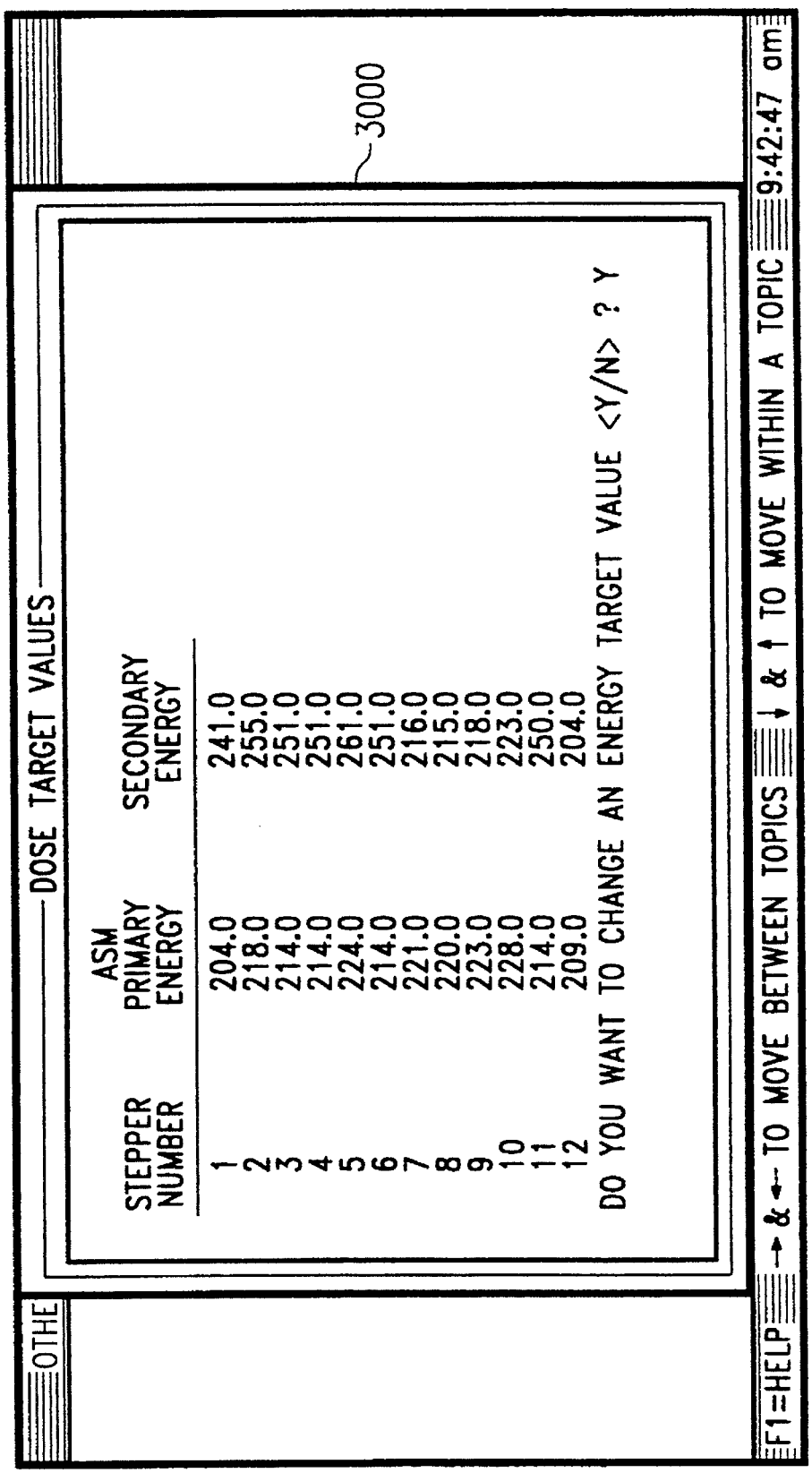
FIG. 30 illustrates a Dose Target Values table generated by the system of the present invention.

Referring again to the Dose Matching option 246 (FIG. 2A), selection of a View Dose Target Values option 242d (FIG. 2D) results in the display of a Dose Target Values table 3000, such as that shown in FIG. 30. The Dose Target Values table 3000 may be used by maintenance to set stepper target energy values.

Referring again to the Dose Matching option 246 (FIG. 2A), selection of an Engineering Options option 242e enables the user to select from among several additional engineering options, as shown in FIG. 2D, including an Engineering Browse option 243j to browse and edit records, a New Limits option 243k to recalculate the control limits on a subset of a stepper's database, a New SPC Rules for Dose Energy option 2431 to change which Western Electric Rules to apply, and a AutoLimit Calculations option 243m for calculating the control limits for all steppers and generating a browse table comprising the control limits.

Figure 31:
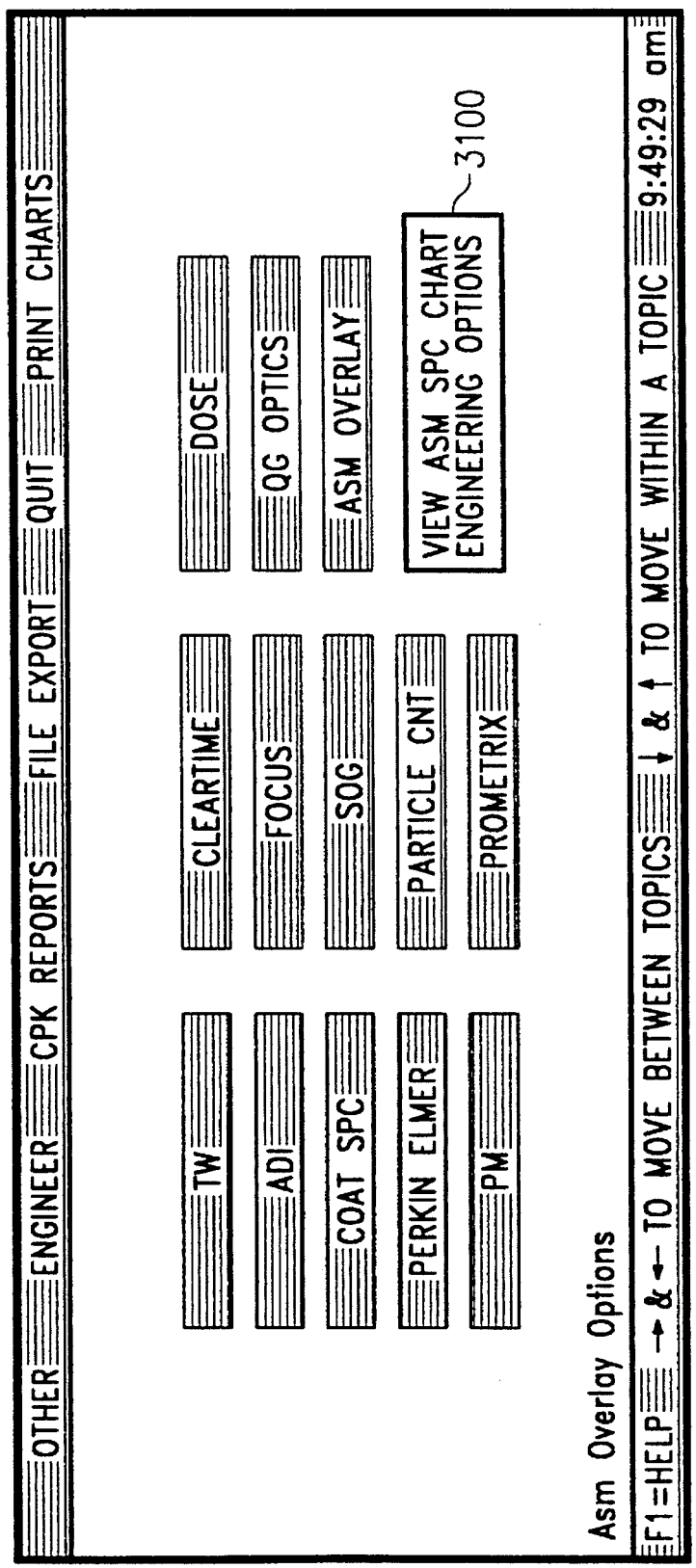
FIG. 31 illustrates an Engineering Options window of the system of the present invention.

Referring again to the Main Menu option 200, selection of the ASM Overlay option 210 results in the display of a Stepper Overlay window 3100, as shown in FIG. 31. Overlay is a term used to describe how well an image from a stepper aligns, overlays or registers to some other image of reference. An operator collects parameter values that track how well overlay occurs. There are different types of overlay errors that can occur, including translation, rotation, magnification, orthogonality and trapezoid. These parameters can help determine what error occurred and how the user can adjust to compensate for or correct the error. Referring again to the Stepper Overlay window 3100 (FIG. 31) and the ASM Overlay option 210 (FIG. 2A), selection of a View ASM SPC Chart option 244 results in the user being prompted to enter a stepper number. Once the user has entered a stepper number, the utility 24 determines whether a file exists for the selected stepper for the current day. If a file for the current day is not found, indicating that no tests have entered for the current day for the selected stepper, the user is prompted to indicate whether he or she wants to enter another date. This situation will occur, for example, when a test run for a certain day has not been saved into the database because the user did not invoke the View ASM SPC Chart option 244 on the same day the test was run by selecting a stepper to be analyzed using the PC, or if the test was not uploaded to the network due to network problems.

Similarly, if a file does exist for the current day for the selected stepper, but the time stamp, corresponding to DOS file time, of the file is not greater than the last time the file was opened and read, indicating that no new data has been added to the file, the user will be prompted to indicate whether he or she wants to enter another date. Alternatively, if the file exists and has a greater time stamp than the last time the file was read, indicating that new data may have been added to the file, the utility 24 will parse through the file to search for new data added thereto since the last time the utility 24 accessed the file in this manner. If there is no new data in the file, the user will be prompted to enter another date; otherwise, the utility 24 will read in the new data, save it, perform calculations on it, and then provide the user with several additional options, as described below.

If in response to the above-described prompt, the user selects a Yes option 244a (FIG. 2E), indicating that the user would like to enter another date, the user is prompted to enter another date. The user may respond to the prompt by typing a date and selecting an OK option 245a (FIG. 2E) to enter the date, or by selecting a Cancel option 245b (FIG. 2E) to return to the View ASM SPC Charts option 244 (FIG. 2A). Responsive to the entry of a new date, the utility 24 determines whether a file exists for the selected new date and stepper. If not, or if a file exists but the time stamp of the file is not greater than the last time the file was opened and read, the user is again prompted to indicate whether he or she wants to enter another date. Alternatively, if the file exists and has a smaller time stamp, the utility 24 accesses and parses through the file to determine whether any new data has been added thereto since the last time the file was read by the utility 24. If not, the user is yet again prompted to indicate whether he or she wants to select another date.

Figure 2E:
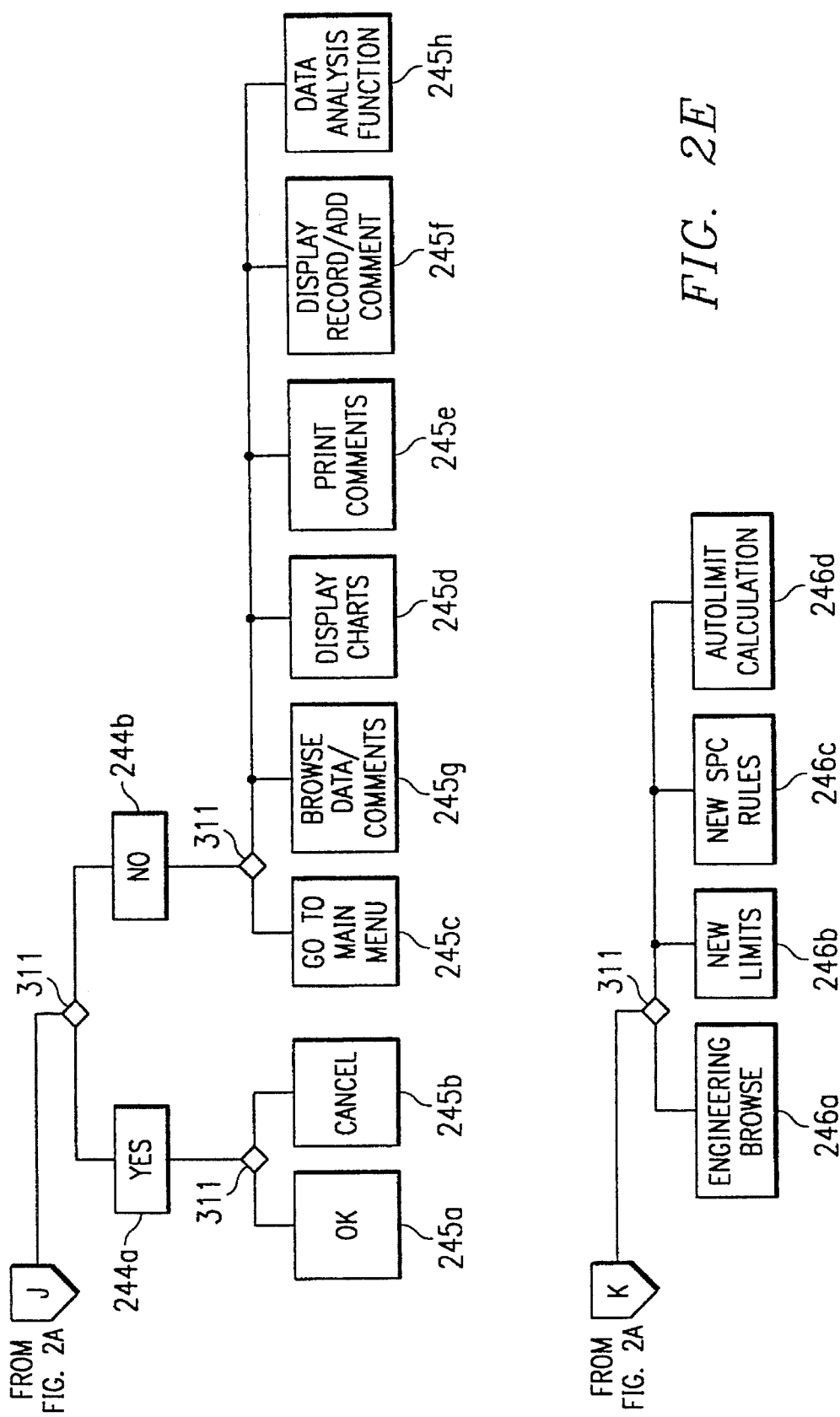
Figure 3:
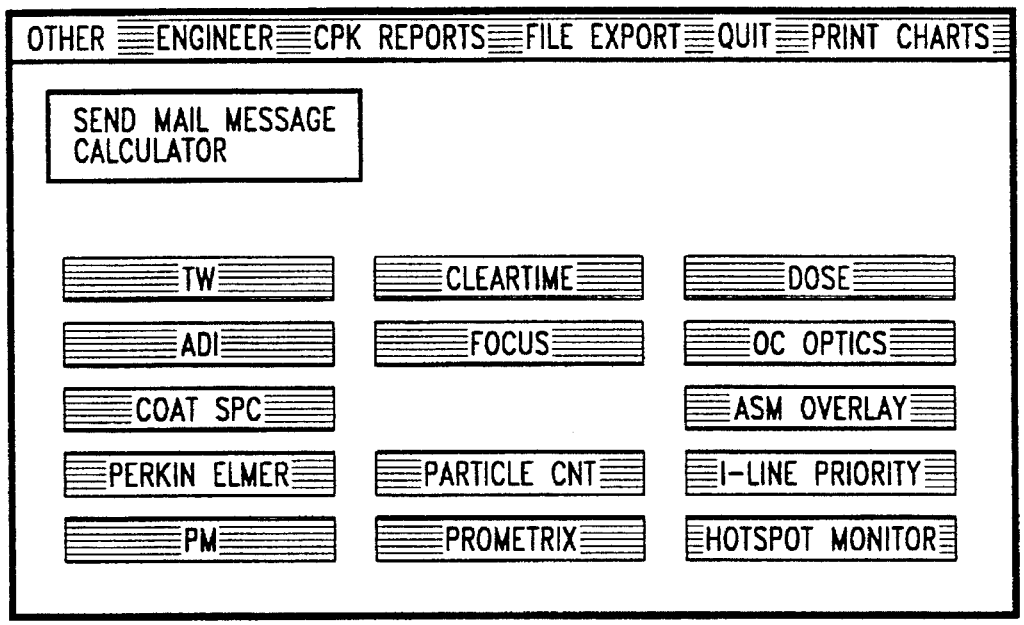
FIG. 3 illustrates a Main Photo screen of the system of the present invention.
Figure 32A:
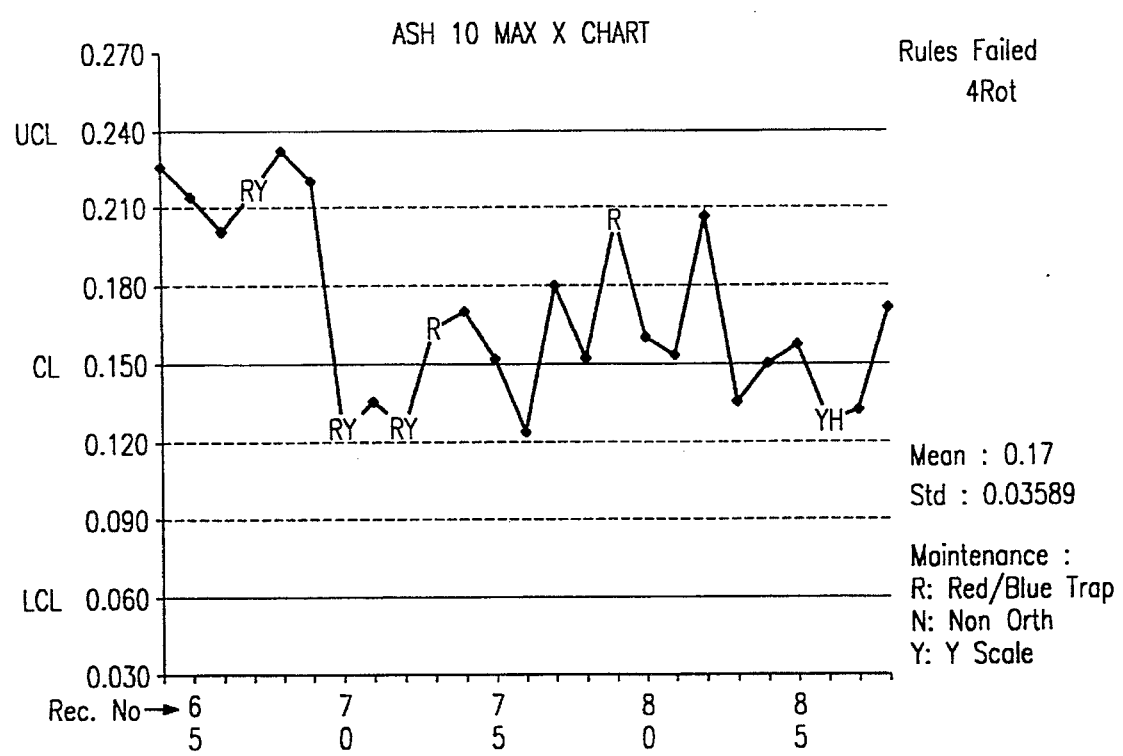

If the user selects a No option 244a (FIG. 2E) in response to the above-discusses prompt, or if the utility locates and parses through a file and determines that new data has been added since the last access thereto, the user is provided with several additional options, including a Go to Main Menu option 245c (FIG. 2E), a Display Charts option 245d (FIG. 2E), a Print Commands option 245e (FIG. 2E), a Display a Record/Add a Comment option 245f (FIG. 2E), a Browse Data/Comments option 245g (FIG. 2E) and a Data Analysis Functions option 245h (FIG. 2E). Selection of the Go to Main Menu option 245c returns the user to the Main Menu 200 screen (FIG. 3). Selection of the Display Charts option 245d generates a series of windows for enabling the user to select between double and single charts and several different display options, including Max X, Max Y, Trap X, Trap Y, Magnification, Rotation, X Off and Y Off. Once the user has selected a display option, the user is prompted to select the number of points to be displayed. FIGS. 32A and 32B illustrate double and single Stepper SPC charts, respectively, generated by the utility 24. Referring to the double chart shown in FIG. 32A, because the chart plots two parameters on the same display, the user is able more readily to see correlations or patterns between the data. Usually, the two parameters are related to the type of overlay error the user is tracking. The letter over each point indicates the type of maintenance that was performed on the stepper about the time the point was entered to correct for overlay errors found. For example, referring to FIG. 32A, point 70 is designated "RY," meaning "red/blue," "trap" and "y-scale" were adjusted.

Referring again to FIG. 2E, selection of the Print Comments option 245e prints records that have comments. Selection of the Display a Record/Add a Comment option 245f causes the view and comments section of a selected record to be displayed. Selection of the Browse Data/Comments 245g causes a browse screen of the steppers database to be displayed. Selection of the Data Analysis Functions option 245h enables the generation of EWMA charts.

Referring again to FIG. 2A, selection of the Engineering Options option 246 from the ASM Overlay option 210 results in the user being presented with various engineering options, including, as shown in FIG. 2E, an Engineering Browse option 246a for generating a browse screen for enabling the user to change or delete record values, a New Limits option 246b for recalculating the control limits on a subset of a steppers database, a New SPC Rules for Dose Energy option 246c, which enables the user to change which Western Electric Rules to apply, and an AutoLimit Calculations option 246d to calculate the control limits for all steppers and put the calculations in a browse table for viewing.

It is understood that the present invention can take many forms and embodiments. The embodiments shown herein are intended to illustrate rather than to limit the invention, it being appreciated that variations may be made without departing from the spirit of the scope of the invention. For example, the system could be used to measure and analyze lens curvature and focal plane deviation, as well as other parameters used in the fabrication of IC chips.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A method of performing automated analysis of the performance of at least one photolithography stepper using test data generated responsive to tests run on said at least one stepper, the method comprising:

responsive to test data being generated by said at least one stepper, automatically and without user involvement appending said test data to a file associated with said at least one stepper, said associated file being stored in a computer electrically connected between said stepper and a network drive;

automatically periodically uploading said associated file to and storing said associated file on said network drive;

responsive to user selection of said at least one stepper, retrieving and parsing said associated file;

performing user-selected analyses on said data; and presenting results of said user selected analyses in a user-selected format.

2. The method of claim 1 further comprising:

logging errors occasioned by said at least one stepper in an error file associated with said at least one stepper;

periodically uploading said associated error file to said network drive;

responsive to user selection of an error file analysis option, retrieving and parsing said associated error file;

presenting said errors stored in said associated error file in a user-selected format.

3. The method of claim 1 wherein said parsed data is stored in a database on said network drive.

4. The method of claim 1 wherein said retrieving and parsing are performed by a computer connected to said network drive.

5. The method of claim 4 wherein said presenting is performed using a display screen of said computer.

6. The method of claim 4 wherein said presenting is performed using a printer connected to said computer.

7. The method of claim 1 wherein said appending and uploading is performed by a computer connected to said at least one stepper.

8. The method of claim 1 wherein said user-selected format comprises at least one of a pareto graph, a chart, or a browse table.

9. The method of claim 1 wherein said network drive is a VAX drive.

10. The method of claim 2 wherein said user-selected format comprises at least one of a pareto graph, an error code distribution sheet, or an error code occurrence sheet.

11. A system for performing automated analysis of the performance of at least one photolithography stepper using test data generated responsive to tests run on said at least one stepper, the system comprising:

means responsive to test data being generated by said at least one stepper for automatically and without user involvement appending said test data to a file associated with said at least one stepper, said associated file being stored in a computer electrically connected between said stepper and a network drive;

means for automatically periodically uploading said associated file to and storing said associated file on said network drive;

means responsive to user selection of said at least one stepper for retrieving and parsing said associated file;

means for performing user-selected analyses on said data; and means for presenting results of said user selected analyses in a user-selected format.

12. The system of claim 11 further comprising:

means for logging errors occasioned by said at least one stepper in an error file associated with said at least one stepper;

means for periodically uploading said associated error file to said network drive;

means responsive to user selection of an error file analysis option, for retrieving and parsing said associated error file;

means for presenting said errors stored in said associated error file in a user-selected format.

13. The system of claim 11 wherein said parsed data is stored in a database on said network drive.

14. The system of claim 11 wherein said means for retrieving and parsing comprises a computer connected to said network drive.

15. The system of claim 14 wherein said means for presenting comprises a display screen of said computer.

16. The system of claim 14 wherein said means for presenting comprises performed using a printer connected to said computer.

17. The system of claim 11 wherein said means for appending and uploading comprises a computer connected to said at least one stepper.

18. The system of claim 11 wherein said user-selected format comprises at least one of a pareto graph, a chart, or a browse table.

19. The system of claim 11 wherein said network drive is a VAX drive.

20. The system of claim 12 wherein said user-selected format comprises at least one of a pareto graph, an error code distribution sheet, or an error code occurrence sheet.

21. A system for automating data collection and analysis of at least one photolithography stepper, the system comprising:

a first computer electrically connected to said at least one stepper for automatically accumulating, without user involvement, test data generated by said at least one stepper responsive to tests performed thereon and appending said test data to a test data file associated with said at least one stepper;

a VAX drive electrically connected to said first computer, said first computer automatically periodically uploading said associated test data file to said VAX drive for storage thereon;

a second computer electrically connected to said VAX drive for receiving input from a user for selecting a stepper, a type of analysis to be performed, and a presentation format;

wherein responsive to receipt of said user input, said second computer retrieves and parses said associated test data file, performs said user-selected analysis and presents results of said user-selected analysis in said user-selected presentation format.

22. The system of claim 21 wherein said parsed data is stored in a database on said VAX drive.

23. The system of claim 21 wherein said second computer comprises a display, said user-selected analysis results being presented to said user on said display.

24. The system of claim 21 further comprising a printer electrically connected to said second computer, said user-selected analysis results being presented to said user using said printer.

25. The system of claim 21 wherein said user-selected presentation format comprises at least one of a pareto graph, a chart, or a browse table.

26. The system of claim 22 wherein said user-selected format comprises at least one of a pareto graph, an error code distribution list, or an error code occurrence list.

* * * * *

UNITED STATES PATENT AND TRADEMARK OFFICE
CERTIFICATE OF CORRECTION

PATENT NO. : 5,586,059 Page 1 of 1
DATED : December 17, 1996
INVENTOR(S) : Oshelski et al.

It is certified that error appears in the above-identified patent and that said Letters Patent is hereby corrected as shown below:

Column 2,
Line 1, "Located" should read -- located --.
Line 5, "modelling" should read -- modeling --.

Column 3,
Line 23, "in" should read -- In --.

Column 4,
Line 47, "assigmnent" should read -- assignment --.

Column 6,
Line 20, "in" should read -- In --.

Column 7,
Line 62, "month.," should read -- month, --.

Column 10,
Line 67, after "row", please delete "a stepper".

Column 11,
Line 30, "indicates" should read -- indicate --.

Column 12,
Line 2, after "calibration" please insert -- . --.
Line 49, "a" should read -- an --.

Signed and Sealed this

Twentieth Day of August, 2002

Attest:

JAMES E. ROGAN
Attesting Officer   Director of the United States Patent and Trademark Office